US012696502B2

(12) United States Patent
Harada et al.

(10) Patent No.: US 12,696,502 B2
(45) Date of Patent: Jul. 28, 2026

(54) SEMICONDUCTOR DEVICE

(71) Applicant: FUJI ELECTRIC CO., LTD.,
Kanagawa (JP)

(72) Inventors: Yuichi Harada, Matsumoto-city (JP);
Seiji Noguchi, Matsumoto-city (JP);
Norihiro Komiyama, Matsumoto-city
(JP); Yoshihiro Ikura, Matsumoto-city
(JP); Yosuke Sakurai, Azumino-city
(JP); Yoshihisa Suzuki, Matsumoto-city
(JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 814 days.

(21) Appl. No.: 17/971,636

(22) Filed: Oct. 23, 2022

(65) Prior Publication Data

US 2023/0038712 A1    Feb. 9, 2023

Related U.S. Application Data

(63) Continuation of application No.
PCT/JP2021/041957, filed on Nov. 15, 2021.

(30) Foreign Application Priority Data

Nov. 17, 2020    (JP) ................................. 2020-190954

(51) Int. Cl.
*H10D 62/13*        (2025.01)
*H10D 8/00*         (2025.01)
(Continued)

(52) U.S. Cl.
CPC .......... *H10D 62/142* (2025.01); *H10D 8/422*
(2025.01); *H10D 12/481* (2025.01); *H10D*
*62/53* (2025.01);
(Continued)

(58) Field of Classification Search
None
See application file for complete search history.

(56) References Cited

U.S. PATENT DOCUMENTS

2013/0075784 A1*   3/2013   Ikeda ..................... H10D 62/60
                                                           257/140
2013/0249058 A1    9/2013   Neidhart
                            (Continued)

FOREIGN PATENT DOCUMENTS

CN        104054178 A      9/2014
CN        107408581 A      11/2017
                           (Continued)

OTHER PUBLICATIONS

Translation of WO-2020100995 (Year: 2020).*
(Continued)

*Primary Examiner* — Jessica S Manno
*Assistant Examiner* — Christopher A. Schodde

(57)    ABSTRACT

Provided is a semiconductor device including: a semiconductor substrate having a drift region of a first conductivity type; and a buffer region of the first conductivity type provided between the drift region and a lower surface of the semiconductor substrate and having a higher doping concentration than the drift region. The buffer region has two or more helium chemical concentration peaks arranged at different positions in a depth direction of the semiconductor substrate.

21 Claims, 34 Drawing Sheets

(51) Int. Cl.
| | |
|---|---|
| *H10D 12/00* | (2025.01) |
| *H10D 62/53* | (2025.01) |
| *H10D 84/60* | (2025.01) |
| *H10P 32/10* | (2026.01) |

(52) U.S. Cl.
CPC ......... *H10D 84/617* (2025.01); *H10P 32/171* (2026.01); *H10P 32/18* (2026.01)

(56) References Cited

U.S. PATENT DOCUMENTS

| | | | | |
|---|---|---|---|---|
| 2014/0217463 | A1 | 8/2014 | Schulze | |
| 2014/0246750 | A1 | 9/2014 | Takishita | |
| 2015/0024556 | A1 | 1/2015 | Miyazaki | |
| 2015/0214347 | A1 | 7/2015 | Falck | |
| 2016/0141399 | A1 | 5/2016 | Jelinek | |
| 2017/0207330 | A1* | 7/2017 | Enomoto | H10D 62/127 |
| 2017/0373141 | A1 | 12/2017 | Yoshida | |
| 2018/0005829 | A1 | 1/2018 | Takishita | |
| 2018/0012762 | A1* | 1/2018 | Mukai | H10D 8/045 |
| 2018/0166279 | A1 | 6/2018 | Tamura | |
| 2019/0148500 | A1* | 5/2019 | Agata | H10D 12/441 257/655 |
| 2019/0287961 | A1 | 9/2019 | Naito | |
| 2019/0326118 | A1 | 10/2019 | Naito | |
| 2020/0058803 | A1* | 2/2020 | Naito | H10D 8/00 |
| 2020/0156120 | A1 | 5/2020 | Amano | |
| 2020/0194550 | A1 | 6/2020 | Baburske | |
| 2020/0194562 | A1* | 6/2020 | Yoshimura | H10D 30/60 |
| 2021/0043739 | A1* | 2/2021 | Kato | H10D 62/60 |
| 2021/0050215 | A1 | 2/2021 | Agata | |
| 2021/0126092 | A1 | 4/2021 | Kubouchi | |
| 2021/0320174 | A1* | 10/2021 | Schulze | H10D 8/00 |

FOREIGN PATENT DOCUMENTS

| | | | | | |
|---|---|---|---|---|---|
| CN | 110546767 | A | 12/2019 | | |
| CN | 111095569 | A | 5/2020 | | |
| CN | 113517330 | A | 10/2021 | | |
| JP | 2002299278 | A | 10/2002 | | |
| JP | 2008135439 | A | 6/2008 | | |
| JP | 2017011000 | A | 1/2017 | | |
| JP | 2019033128 | A | 2/2019 | | |
| JP | 2019161168 | A | 9/2019 | | |
| JP | 2021100678 | A | 7/2021 | | |
| WO | 2013089256 | A1 | 6/2013 | | |
| WO | 2013147275 | A1 | 10/2013 | | |
| WO | 2017047285 | A1 | 3/2017 | | |
| WO | 2017146148 | A1 | 8/2017 | | |
| WO | 2019013286 | A1 | 1/2019 | | |
| WO | 2019098270 | A1 | 5/2019 | | |
| WO | 2019181852 | A1 | 9/2019 | | |
| WO | 2020100997 | A1 | 5/2020 | | |
| WO | WO-2020100995 | A1 * | 5/2020 | .......... | H01L 21/324 |
| WO | 2020149354 | A1 | 7/2020 | | |

OTHER PUBLICATIONS (ISA/237) Written Opinion of the International Search Authority for International Patent Application No. PCT/JP2021/041957, issued/ mailed by the Japan Patent Office on Feb. 1, 2022.
Office Action issued for counterpart Chinese Application 202180030596. 8, issued by The State Intellectual Property Office of People's Republic of China on Sep. 3, 2025.
Office Action issued for counterpart Chinese Application 202180030596. 8, issued by The State Intellectual Property Office of People's Republic of China on Mar. 4, 2026.

* cited by examiner

100

SEMICONDUCTOR DEVICE

The contents of the following Japanese patent application(s) are incorporated herein by reference:
NO. 2020-190954 filed in JP on Nov. 17, 2020
NO. PCT/JP2021/041957 filed in WO on Nov. 15, 2021

BACKGROUND

1. Technical Field

The present invention relates to a semiconductor device.

2. Related Art

Conventionally, a technique for forming lattice defects by implanting particles such as helium into a semiconductor device is known (see, for example, Patent Document 1).
Patent Document 1: Japanese Patent Application Publication No. 2008-135439

DESCRIPTION OF EXEMPLARY EMBODIMENTS

Figure 1:
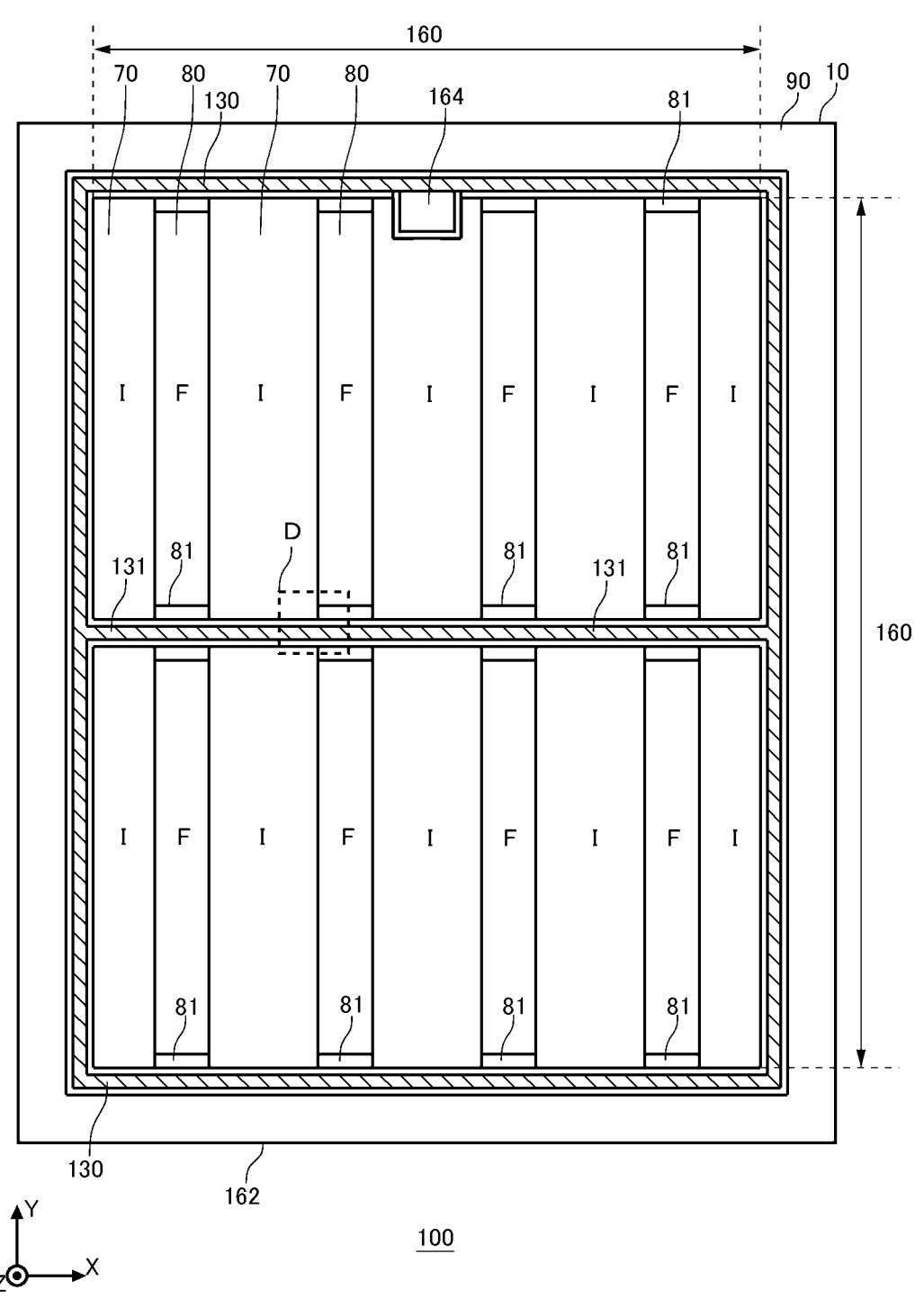
FIG. 1 illustrates a top view showing an example of a semiconductor device 100.

Hereinafter, the invention will be described through embodiments of the invention, but the following embodiments do not limit the invention according to claims. In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

Further, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D$-$N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the semiconductor substrate of the present specification, bulk donors of the N type are distributed throughout. The bulk donor is a dopant donor substantially uniformly contained in an ingot during the manufacture of the ingot from which the semiconductor substrate is made. The bulk donor of this example is an element other than hydrogen. The bulk donor dopant is, for example, phosphorous, antimony, arsenic, selenium, or sulfur, but the invention is not limited to these. The bulk donor of this example is phosphorous. The bulk donor is also contained in a P type region. The semiconductor substrate may be a wafer cut out from a semiconductor ingot, or may be a chip obtained by singulating the wafer. The semiconductor ingot may be manufactured by either a Czochralski method (CZ method), a magnetic field applied Czochralski method (MCZ method), or a float zone method (FZ method). The ingot in this example is manufactured by the MCZ method. An oxygen concentration contained in the substrate manufactured by the MCZ method is $1 \times 10^{17}$ to $7 \times 10^{17}/cm^3$. The oxygen concentration contained in the substrate manufactured by the FZ method is $1 \times 10^{15}$ to $5 \times 10^{16}/cm^3$. When the oxygen concentration is high, hydrogen donors tend to be easily generated. The bulk donor concentration may use a chemical concentration of bulk donors distributed throughout the semiconductor substrate, or may be a value between 90% and 100% of the chemical concentration. Further, as the semiconductor substrate, a non-doped substrate not containing a dopant such as phosphorous may be used. In that case, the bulk donor concentration ($D_0$) of the non-doped substrate is, for example, from $1 \times 10^{10}/cm^3$ or more and to $5 \times 10^{12}/cm^3$ or less. The bulk donor concentration ($D_0$) of the non-doped substrate is preferably $1 \times 10^{11}/cm^3$ or more. The bulk donor concentration ($D_0$) of the non-doped substrate is preferably $5 \times 10^{12}/cm^3$ or less. Each concentration in the present invention may be a value at room temperature. As an example, a value at 300K (Kelvin) (about 26.9 degrees C.) may be used as the value at room temperature.

In the present specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type. In the specification, a unit system is the SI base unit system unless otherwise particularly noted. Although a unit of length is represented using cm, it may be converted to meters (m) before calculations.

A chemical concentration in the present specification indicates an atomic density of an impurity measured regardless of an electrical activation state. The chemical concentration can be measured by, for example, secondary ion mass spectrometry (SIMS). The net doping concentration described above can be measured by voltage-capacitance profiling (CV profiling). Further, a carrier concentration measured by spreading resistance profiling (SRP method) may be set as the net doping concentration. The carrier means a charge carrier of an electron or a hole. The carrier concentration measured by the CV profiling or the SRP method may be a value in a thermal equilibrium state.

Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping. In the present specification, atoms/cm$^3$ or/cm$^3$ is used to indicate a concentration per unit volume. This unit is used for a concentration of a donor or an acceptor in a semiconductor substrate, or a chemical concentration. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The decrease in carrier mobility occurs when carriers are scattered due to disorder (disorder) of a crystal structure due to a lattice defect or the like. The reason why the carrier concentration decreases is as follows. In the SRP method, the spreading resistance is measured, and the carrier concentration is converted from the measured value of the spreading resistance. At this time, the mobility of the crystalline state is used as the mobility of the carrier. On the other hand, at the position where the lattice defect is introduced, the carrier concentration is calculated from the carrier mobility in the crystalline state although the carrier mobility decreases. Therefore, the value of the carrier concentration is smaller than that of the actual carrier concentration, that is, the concentration of the donor or acceptor.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 illustrates a top view showing an example of a semiconductor device 100. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. The semiconductor substrate 10 has an end side 162 in the top view. When merely referred to as the top view in the present specification, it means that the semiconductor substrate 10 is viewed from an upper surface side. The semiconductor substrate 10 of this example has two sets of end sides 162 opposite to each other in the top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1.

The active portion 160 is provided with at least one of a transistor portion 70 including a transistor element such as an IGBT, and a diode portion 80 including a diode element such as a freewheeling diode (FWD). In the example of FIG. 1, the transistor portion 70 and the diode portion 80 are arranged alternately along a predetermined array direction (the X axis direction in this example) on the upper surface of the semiconductor substrate 10. The active portion 160 in another example may be provided with only one of the transistor portion 70 and the diode portion 80.

In FIG. 1, a region where each of the transistor portions 70 is arranged is indicated by a symbol "I", and a region where each of the diode portions 80 is arranged is indicated by a symbol "F". In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described below may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of P+ type may be provided in a region other than the cathode region. In the specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 164. The semiconductor device 100 may have a pad such as an anode pad, a cathode pad, and a current detection pad. Each pad is arranged in a region close to the end side 162. The region close to the end side 162 refers to a region between the end side 162 and the emitter electrode in the top view. When the semiconductor device 100 is mounted, each pad may be connected to an external circuit via a wiring such as a wire.

A gate potential is applied to the gate pad 164. The gate pad 164 is electrically connected to a conductive portion of a gate trench portion of the active portion 160. The semiconductor device 100 includes a gate runner that connects the gate pad 164 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 162 of the semiconductor substrate 10 in the top view. The outer circumferential gate runner 130 of this example encloses the active portion 160 in the top view. A region enclosed by the outer circumferential gate runner 130 in the top view may be the active portion 160. Further, the outer circumferential gate runner 130 is connected to the gate pad 164. The outer circumferential gate runner 130 is arranged above the semiconductor substrate 10. The outer circumferential gate runner 130 may be a metal wiring including aluminum.

The active-side gate runner 131 is provided in the active portion 160. Providing the active-side gate runner 131 in the active portion 160 can reduce a variation in wiring length from the gate pad 164 for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction, the outer circumferential gate runner 130 enclosing the active portion 160. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 162 in the top view. The edge termination structure portion 90 of this example is arranged between the outer circumferential gate runner 130 and the end side 162. The edge termination structure portion 90 reduces an electric field strength on the upper surface side of the semiconductor substrate 10. The edge termination structure portion 90 may include at least one of a guard ring, a field plate, and a RESURF which are annularly provided to enclose the active portion 160.

Figure 2:
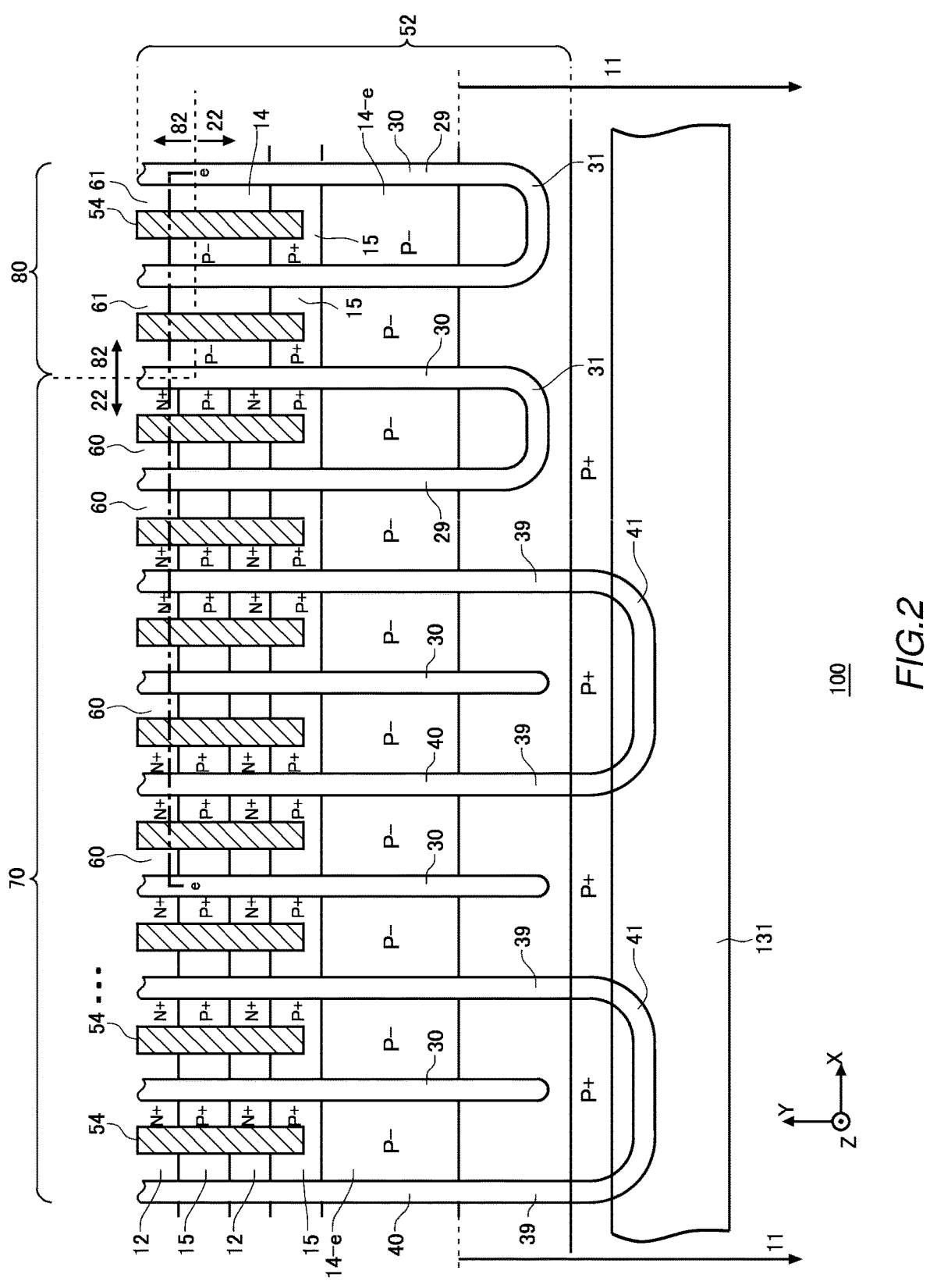
FIG. 2 illustrates an enlarged view of a region D in FIG. 1.

FIG. 2 illustrates an enlarged view of a region D in FIG. 1. The region D is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. Further, the semiconductor device 100 of this example includes an emitter electrode 52 and the active-side gate runner 131 that are provided above the upper surface of the semiconductor substrate 10. The emitter electrode 52 and the active-side gate runner 131 are provided in isolation each other.

An interlayer dielectric film is provided between the emitter electrode 52 and the active-side gate runner 131, and the upper surface of the semiconductor substrate 10, but the interlayer dielectric film is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including a metal. FIG. 2 shows a range where the emitter electrode 52 is provided. For example, at least a part of a region of the emitter electrode 52 is formed of aluminum or an aluminum-silicon alloy, for example, a metal alloy such as AlSi, AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a second conductivity type region in which the doping concentration is higher than the base region 14. The base region 14 of this example is a P− type, and the well region 11 is a P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is desirably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the extending direction, or may have linear portions 29 and an edge portion 31 similar to the gate trench portion 40. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom in the depth direction of each trench portion is covered with the well region 11 at the end portion in the Y axis direction of each trench portion. With this configuration, the electric field strength on the bottom portion of each trench portion can be reduced.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. While FIG. 2 shows the base region 14-e arranged at one end portion of each mesa portion in the extending direction, the base region 14-e is also arranged at the other end portion of each mesa portion. Each mesa portion may be provided with at least one of a first conductivity type of emitter region 12, and a second conductivity type of contact region 15 in a region sandwiched between the base regions 14-e in the top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. In the mesa portion 60 in contact with the gate trench portion 40, the contact region 15 exposed to the upper surface of the semiconductor substrate 10 may be provided.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-e on the upper surface of the mesa portion 61, the contact region 15 may be provided in contact with each base region 14-e. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-e. The contact hole 54 of this example is provided above respective regions of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region of the P+ type 22 may be provided in a region where the cathode region 82 is not provided. The cathode region 82 and the collector region 22 are provided between a lower surface 23 of the semiconductor substrate 10 and a buffer region 20. In FIG. 2, a boundary between the cathode region 82 and the collector region 22 is indicated by a dotted line.

The cathode region 82 is arranged away from the well region 11 in the Y axis direction. With this configuration, the distance between the P type region (the well region 11) having a relatively high doping concentration and formed up to the deep position, and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

First Example

Figure 3:
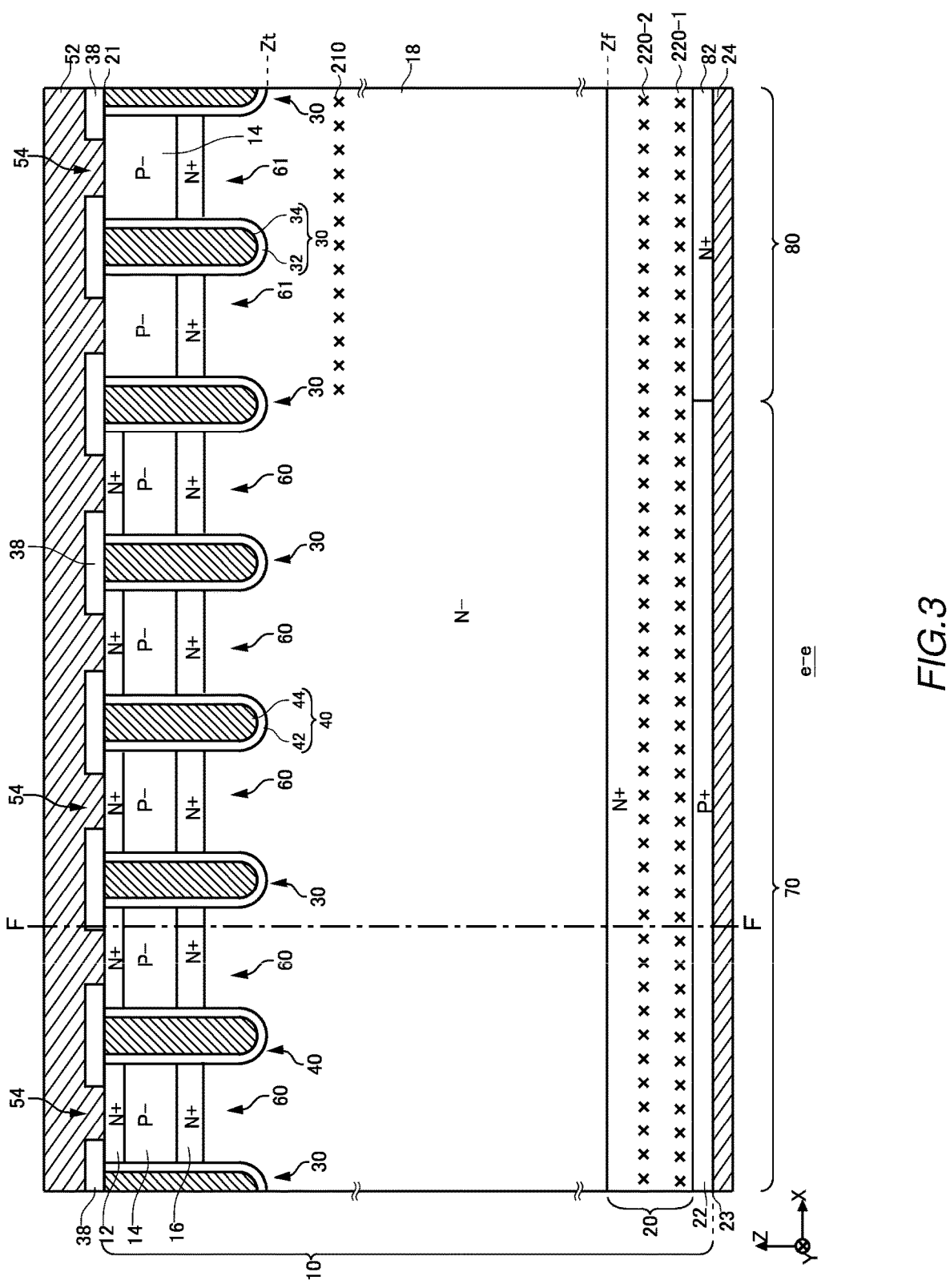
FIG. 3 illustrates a view showing an example of a cross section e-e in FIG. 2.

FIG. 3 illustrates a view showing an example of a cross section e-e in FIG. 2. The cross section e-e is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the specification, the direction in which the emitter electrode 52 is connected to the collector electrode 24 (the Z axis direction) is referred to as a depth direction.

The semiconductor substrate 10 includes an N type or N+ type of drift region 18. The drift region 18 is provided in each of the transistor portion 70 and the diode portion 80.

In the mesa portion 60 of the transistor portion 70, an N+ type of emitter region 12 and a P− type of base region 14 are provided in order from an upper surface 21 side of the semiconductor substrate 10. The drift region 18 is provided below the base region 14. The mesa portion 60 may be provided with an N+ type of accumulation region 16. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N+ type region with a higher doping concentration than the drift region 18. That is, the accumulation region 16 has a higher donor concentration than the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the P− type of base region 14 in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, an N+ type buffer region 20 may be provided below the drift region 18. The doping concentration of the buffer region 20 is higher than the doping concentration of the drift region 18. The buffer region 20 may have a concentration peak having a higher doping concentration than the doping concentration of the drift region 18. The doping concentration of the concentration peak indicates a doping concentration at the local maximum of the concentration peak. Further, as the doping concentration of the drift region 18, an average value of doping concentrations in the region where the doping concentration distribution is substantially flat may be used.

The buffer region 20 may have two or more concentration peaks in the depth direction (Z axis direction) of the semiconductor substrate 10. The concentration peak of the buffer region 20 may be provided at the same depth position as, for example, a chemical concentration peak of hydrogen (proton) or phosphorous. The buffer region 20 may function as a field stopper layer which prevents a depletion layer expanding from the lower end of the base region 14 from reaching the collector region of the P+ type 22 and the cathode region 82 of the N+ type. In the present specification, a depth position of an upper end of the buffer region 20 is set as Zf. The depth position Zf may be a position at which the doping concentration is higher than the doping concentration of the drift region 18.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and reaches the drift region 18. In a region where at least any one of the emitter region 12, the contact region 15, and the accumulation region 16 is provided, each trench portion also passes through the doping regions of these to reach the drift region 18. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottoms of the dummy trench portion 30 and the gate trench portion 40 may be formed in a curved-surface shape (a curved-line shape in the cross section) convexly downward. In the present specification, a depth position of a lower end of the gate trench portion 40 is set as Zt.

An upper-surface-side lifetime killer 210 may be provided on the upper surface 21 side of the semiconductor substrate 10. The upper-surface-side lifetime killer 210 is a recombination center of a lattice defect or the like locally formed in the depth direction. In each drawing, the peak position of the density distribution of the lifetime killer in the depth direction is schematically indicated by an X mark. In the present specification, the peak position will be described as the position of the lifetime killer. The X marks are discretely arranged in the X axis direction, but the lifetime killer is uniformly provided in the X axis direction unless otherwise described.

The upper-surface-side lifetime killer 210 can be formed by implanting particles such as helium into a predetermined depth position from the upper surface 21 of the semiconductor substrate 10. A concentration peak of particles such as helium may be arranged at the same depth position as that of the upper-surface-side lifetime killer 210. The upper-surface-side lifetime killer 210 may be arranged below each trench portion. Further, the upper-surface-side lifetime killer 210 is preferably provided at a position not overlapping the gate trench portion 40 in the top view. With this configuration, the upper-surface-side lifetime killer 210 can be formed by implanting particles such as helium without damaging the gate dielectric film 42. The upper-surface-side lifetime killer 210 of this example is provided over the entire diode portion 80 in the top view. The upper-surface-side lifetime killer 210 in FIG. 3 is not provided in the transistor portion 70, but in another example, the upper-surface-side lifetime killer 210 may be provided in a part of a region of the transistor portion 70.

A lower-surface-side lifetime killer 220 is provided on the lower surface 23 side of the semiconductor substrate 10. The lower-surface-side lifetime killer 220 may be formed by implanting particles such as helium from the lower surface 23 side of the semiconductor substrate 10. A plurality of the lower-surface-side lifetime killers 220 may be arranged at different positions in the depth direction. In the example of FIG. 3, a first lower-surface-side lifetime killer 220-1 and a second lower-surface-side lifetime killer 220-2 are arranged at different depth positions. However, the lower-surface-side lifetime killers 220 may be provided at three or more depth positions. A peak of a helium chemical concentration may be provided at the same depth position as that of each of the lower-surface-side lifetime killers 220.

In the buffer region 20, two or more lower-surface-side lifetime killers 220 may be provided. This makes it easy to control the distribution of the lifetime killer in the buffer region 20. Therefore, the carrier lifetime can be controlled precisely.

The lower-surface-side lifetime killer 220 may be provided over the entire diode portion 80 in the top view. Further, the lower-surface-side lifetime killer 220 may be provided over the entire transistor portion 70 in the top view. The lower-surface-side lifetime killer 220 may be provided over the entire active portion 160 in the top view, or may be provided over the entire semiconductor substrate 10 in the top view. The first lower-surface-side lifetime killer 220-1 and the second lower-surface-side lifetime killer 220-2 may be provided in the same range in the top view.

Figure 4A:
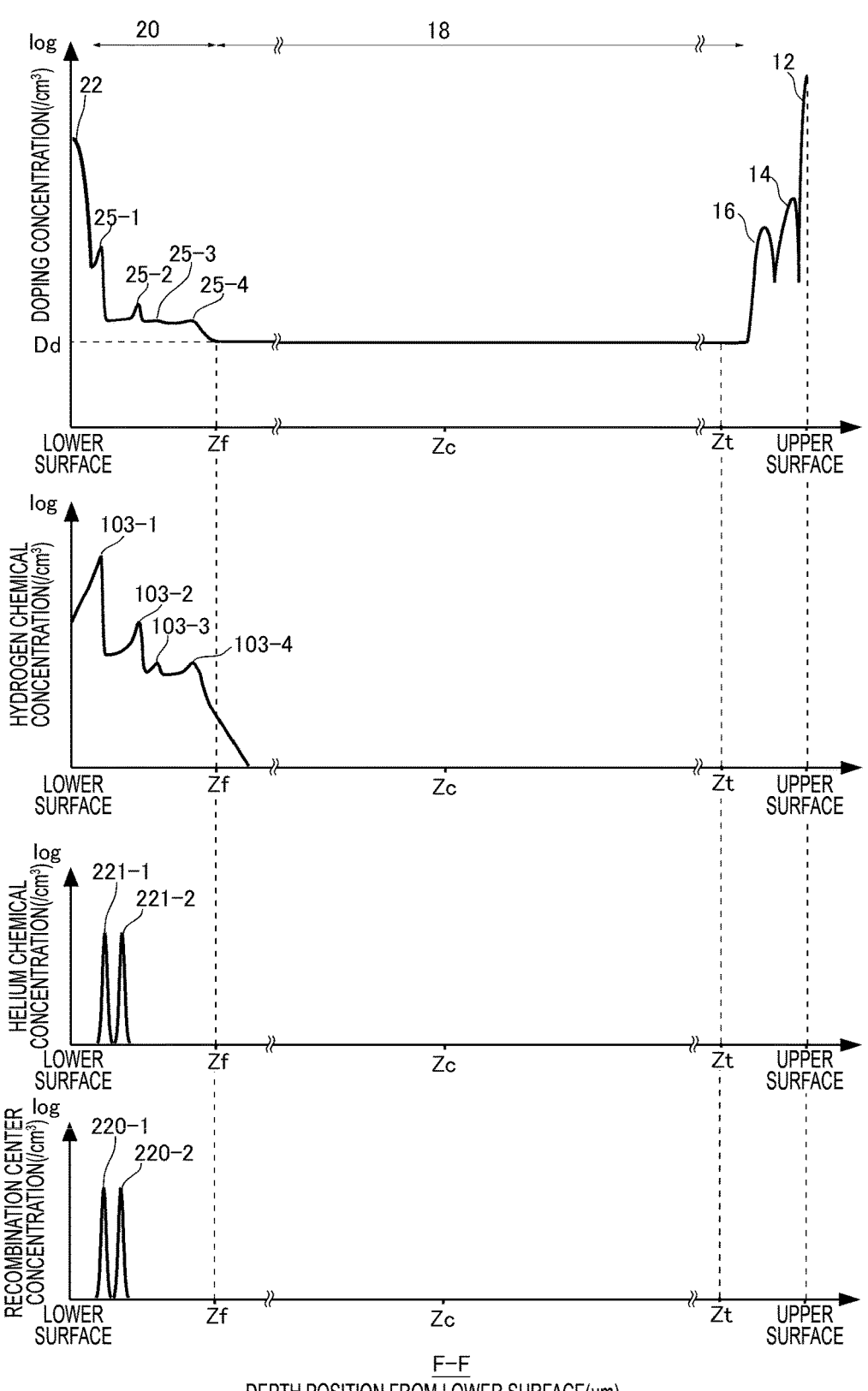
FIG. 4A illustrates a view showing an example of a doping concentration distribution, a hydrogen chemical concentration distribution, a helium chemical concentration distribution, and the recombination center concentration distribution taken along line F-F in FIG. 3.

FIG. 4A illustrates a view showing an example of a doping concentration distribution, a hydrogen chemical concentration distribution, a helium chemical concentration distribution, and a recombination center concentration distribution taken along line F-F in FIG. 3. In FIG. 4A, the center position in the depth direction of the semiconductor substrate 10 is set as Zc. That is, the region on the upper surface 21 side of the semiconductor substrate 10 is a region between the upper surface 21 and the center position Zc, and the region on the lower surface 23 side is a region between the lower surface 23 and the center position Zc.

The emitter region 12 contains an N type dopant such as phosphorous. The base region 14 contains a P type dopant such as boron. The accumulation region 16 contains an N type dopant such as phosphorous or hydrogen. The doping concentration distribution may have respective concentration peaks in the emitter region 12, the base region 14, and the accumulation region 16.

The drift region 18 is a region having a substantially flat doping concentration. A doping concentration Dd of the drift region 18 may be the same as the bulk donor concentration of the semiconductor substrate 10, or may be higher than the bulk donor concentration.

The buffer region 20 of this example has a plurality of doping concentration peaks 25-1, 25-2, 25-3, and 25-4 in the doping concentration distribution. Each doping concentration peak 25 may be formed by locally implanting hydrogen ions. In another example, each doping concentration peak 25 may be formed by implanting an N type dopant such as phosphorous. The collector region 22 contains a P type dopant such as boron. Further, the cathode region 82 shown in FIG. 3 contains an N type dopant such as phosphorous.

The hydrogen chemical concentration distribution of this example has a plurality of local hydrogen chemical concentration peaks 103 in the buffer region 20. By implanting hydrogen ions into the buffer region 20, a VOH defect in which hydrogen, lattice defects, and oxygen are combined is formed and functions as a donor. The hydrogen chemical concentration peak 103 of this example is provided at the same depth position as that of the doping concentration peak 25. Providing two peaks at the same depth position means that the local maximum of one peak is arranged within a range of the full width at half maximum of the other peak. When the concentration of the hydrogen chemical concentration peak 103 is not sufficiently high, a clear doping concentration peak 25 may not be observed at the same depth position as that of the hydrogen chemical concentration peak 103. The hydrogen chemical concentration of this example steeply decreases immediately after entering the drift region 18 from the buffer region 20. Thus, VOH defects are hardly formed in the drift region 18. In another example, hydrogen may diffuse into the drift region 18 to form VOH defects. In this case, the doping concentration of the drift region 18 is higher than the bulk donor concentration.

The buffer region 20 has two or more helium chemical concentration peaks 221 arranged at different positions in the depth direction of the semiconductor substrate 10. In this example, a first helium chemical concentration peak 221-1 and a second helium chemical concentration peak 221-2 are provided in the buffer region 20. The second helium chemical concentration peak 221-2 is arranged farther away from the lower surface 23 than the first helium chemical concentration peak 221-1.

As described above, the lower-surface-side lifetime killer 220 is formed in the vicinity of each helium chemical concentration peak 221. The lower-surface-side lifetime killer 220 may be a recombination center that promotes carrier recombination. The recombination center may be a lattice defect. The lattice defects may be mainly composed of vacancies such as monatomic vacancies (V) and divacancies (VV), may be dislocations, may be interstitial atoms, or may be transition metals or the like monatomic vacancies. For example, atoms adjacent to the vacancies have dangling bonds. In a broad sense, the lattice defects may include donors and acceptors. However, in the present specification, the lattice defects mainly composed of vacancies may be referred to as vacancy-type lattice defects, vacancy-type defects, or simply lattice defects. In the present specification, the lattice defect may be simply referred to as a recombination center or a lifetime killer as a recombination center contributing to the carrier recombination. The lifetime killer may be formed by implanting helium ions into the semiconductor substrate 10. Since the lifetime killer formed by implanting helium may be terminated by hydrogen existing in the buffer region 20, the depth position of the density peak of the lifetime killer may not be identical to the depth position of the helium chemical concentration peak 221.

By implanting helium into two or more depth positions of the buffer region 20, the density distribution of the lower-surface-side lifetime killer 220 in the buffer region 20 can be easily controlled. $^3$He or $^4$He may be implanted into each depth position. $^3$He is a helium isotope including two protons and one neutron. $^4$He is a helium isotope including two protons and two neutrons.

When $^3$He or $^4$He is implanted, without passing through a buffer material (aluminum or the like), with the smallest acceleration energy at which the implantation depth is uniquely determined, a half-value width in the depth direction of the concentration peak of the helium chemical concentration can be reduced.

Figure 4B:
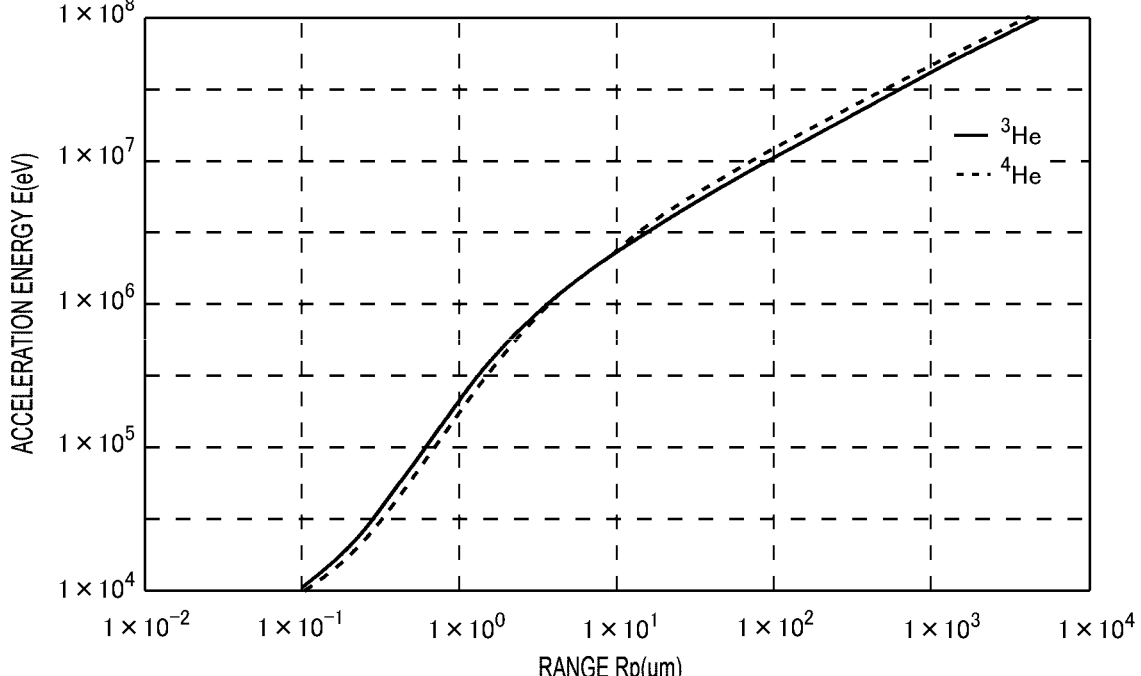
FIG. 4B illustrates a view showing a relationship between an implantation depth (Rp) of ions and acceleration energy required for implantation.

FIG. 4B illustrates a view showing a relationship between an implantation depth (Rp) of ions and acceleration energy required for implantation. In this example, helium ions are directly implanted into the silicon semiconductor substrate 10 without passing through the buffer material. In FIG. 4B, a horizontal axis represents a range Rp(μm), and a vertical axis represents the acceleration energy E(eV) required for implantation. In FIG. 4B, an example of $^3$He is indicated by a solid line, and an example of $^4$He is indicated by a broken line.

$\log_{10}$ (Rp) is set as x, and $\log_{10}$ (E) is set as y. In $^3$He, a relationship between the range Rp and acceleration energy E may be given by Equation (1).

$$y=4.52505E\text{-}03x^6-4.71471E\text{-}02x^5+1.67185E\text{-}01x^4-$$
$$1.72038E\text{-}01x^3-2.92723E\text{-}01x^2+1.39782E+$$
$$00x+5.33858E+00 \qquad \text{Equation (1)}$$

Note that E-A is $10^{-4}$, and E+A is $10^4$. The acceleration energy calculated by substituting an actual range Rp' at the time of manufacturing the semiconductor device 100 into Equation (1) is set as E. When actual acceleration energy E' at the time of manufacture is within ±20% of the acceleration energy E calculated from Equation (1), it may be considered that $^3$He is used.

In $^4$He, the relationship between the range Rp and the acceleration energy E may be given by Equation (2).

$$y=2.90157E\text{-}03x^6-3.66593E\text{-}02x^5+1.59363E\text{-}01x^4-$$
$$2.31938E\text{-}01x^3-2.00999E\text{-}01x^2+1.45891E+$$
$$00x+5.27160E+00 \qquad \text{Equation (2)}$$

When the actual acceleration energy E' at the time of manufacture is within ±20% of the acceleration energy E calculated from Equation (2) using the actual range Rp', it may be considered that $^4$He is used.

As illustrated in FIG. 4B, when the range Rp is equal to or larger than a boundary value with a value of a region where the range Rp is 8 m to 10 m set as the boundary value, the acceleration energy of $^4$He is higher by approximately 10% than the acceleration energy of $^3$He. When the range Rp is equal to or less than the boundary value, the acceleration energy of $^3$He is higher by approximately 10% than the acceleration energy of $^4$He. This is presumed to be due to changes in a balance between an electron stopping power and a nuclear stopping power depending on the number of neutrons of the isotope. As an example, when the range Rp is 10 m or less, $^4$He may be used. Accordingly, helium ions can be implanted with approximately 10% lower acceleration energy. When the range Rp is larger than 10 μm, $^3$He may be used.

Figure 4C:
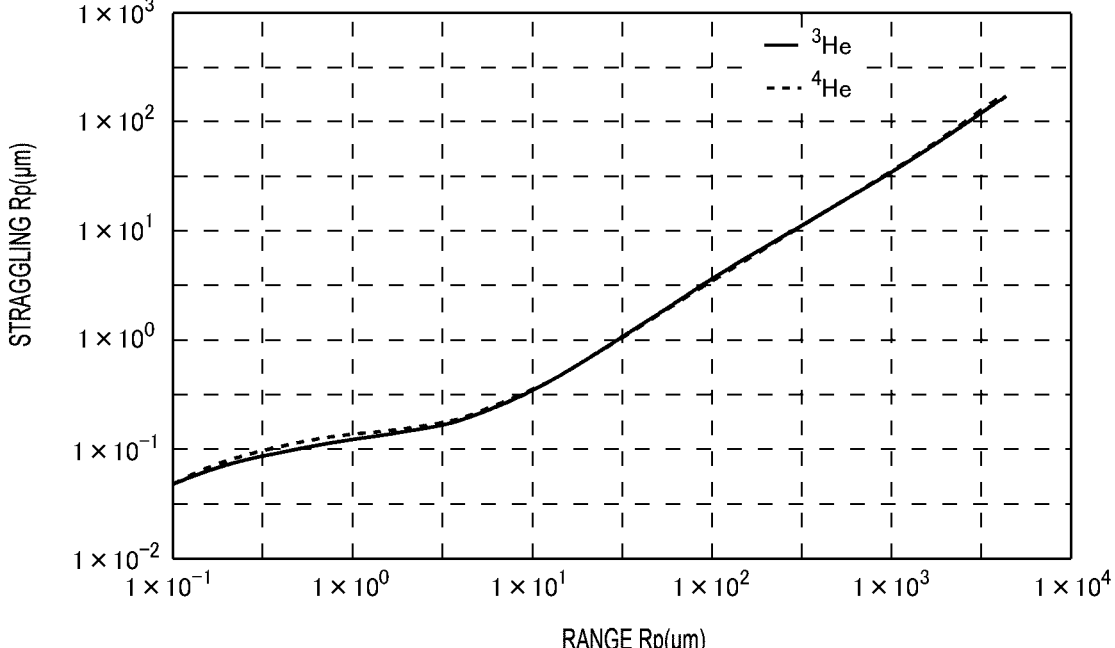
FIG. 4C illustrates a view showing a relationship between the implantation depth (Rp) of ions and a straggling (ΔRp, standard deviation) in an implantation direction.

FIG. 4C illustrates a view showing a relationship between the implantation depth (Rp) of ions and a straggling (ΔRp, standard deviation) in an implantation direction. The implantation direction in this example is the depth direction of the semiconductor substrate 10. Also in this example, helium ions are directly implanted into the silicon semiconductor substrate 10 without passing through the buffer material. In FIG. 4C, a horizontal axis represents the range Rp (m), and a vertical axis represents the straggling ΔRp (μm). In FIG. 4C, an example of $^3$He is indicated by a solid line, and an example of $^4$He is indicated by a broken line.

The straggling ΔRp may be calculated assuming that the helium concentration distribution is a Gaussian distribution. For example, the straggling ΔRp may be a distance (distribution width) between two points having a concentration of 0.60653 times the concentration peak value, or may be a distance between two points having a concentration of 0.6 times the concentration peak value. When a local minimum value or the like between the adjacent concentration peaks is larger than 0.6 times the concentration peak value, a distance between inflection points such as the local minimum value of the concentration distribution may be used as the straggling ΔRp.

$\log_{10}$ (Rp) is set as x, and $\log_{10}$ (ΔRp) is set as y.

In $^3$He, the relationship between the range Rp and the straggling ΔRp may be given by Equation (3).

$$y=5.00395E-04x^6+9.91651E-03x^5-9.76015E-02x^4+ \\ 2.12587E-01x^3+1.30994E-01x^2+2.25458E- \\ 01x-8.59463E-01 \quad \text{Equation (3)}$$

The straggling calculated by substituting the actual range Rp' at the time of manufacturing the semiconductor device 100 into Equation (3) is set as ΔRp. When the actual straggling ΔRp' at the time of manufacture is within ±20% of the straggling ΔRp calculated from Equation (3), it may be considered that $^3$He is used. The actual straggling ΔRp' preferably does not include helium diffusion due to thermal annealing. The actual straggling ΔRp' may be a value measured after helium implantation and before thermal annealing, or may be a value obtained by subtracting the helium diffusion from the value measured after the thermal annealing.

In $^4$He, the relationship between the range Rp and the straggling ΔRp may be given by Equation (4).

$$y=3.10234E-03x^6-9.20762E-03x^5-6.13612E-02x^4+ \\ 2.34304E-01x^3+3.88591E-02x^2+2.22955E- \\ 01x-8.01967E-01 \quad \text{Equation (4)}$$

When the actual straggling ΔRp' at the time of manufacture is within ±20% of the straggling ΔRp calculated from Equation (4) using the actual range Rp', it may be considered that $^4$He is used. The actual straggling ΔRp' preferably does not include helium diffusion due to thermal annealing.

As illustrated in FIG. 4C, when the range Rp is equal to or less than a boundary value with a value of a region where the range Rp is 10 to 20 m set as the boundary value, the straggling ΔRp of $^3$He is smaller by approximately 10% than the straggling ΔRp of $^4$He. When the range Rp is equal to or larger than the boundary value, the straggling ΔRp are substantially equal between $^3$He and $^4$He. This is presumed to be due to changes in a balance between an electron stopping power and a nuclear stopping power depending on the number of neutrons of the isotope.

As an example, when the range Rp is 20 m or less, $^3$He may be used. Accordingly, the straggling ΔRp can be made approximately 10% smaller. Alternatively, in a case where a difference which is given to the helium chemical concentration distribution or electrical characteristics by the difference of approximately 10% in the straggling ΔRp is sufficiently small, even when the range Rp is 20 m or less, it may be considered that the stragglings ΔRp are substantially equal between $^3$He and $^4$He. In this case, helium atoms implanted into the semiconductor substrate 10 may be $^3$He or may be $^4$He.

As an example, the full width at half maximum of the helium chemical concentration peak 221 when $^4$He is implanted is 1 m or less. The full width at half maximum of the helium chemical concentration peak 221 may be 0.5 m or less. By arranging a plurality of helium chemical concentration peaks 221 having a small half-value width in the buffer region 20, the distribution shape of the lower-surface-side lifetime killer 220 can be easily controlled. Further, it is possible to suppress VOH defects formed by helium implantation from being distributed in a wide range. Thus, the doping concentration distribution of the buffer region 20 can be suppressed from varying in a wide range.

Further, by providing the plurality of helium chemical concentration peaks 221, the total concentration of the lower-surface-side lifetime killer 220 can be maintained high. Thus, the lifetime of the carrier can be shortened at the time of turning off the semiconductor device 100 or the like, and a tail current can be suppressed.

When the acceleration energy E of $^3$He is approximately 20 MeV or more (the range Rp is 270 m or more), the straggling ΔRp is 10 m or more. When the acceleration energy E of $^4$He is approximately 21 MeV or more (the range Rp is 250 m or more), the straggling ΔRp is 10 m or more. In this case, the full width at half maximum of the helium chemical concentration peak 221 cannot be made sufficiently smaller than the width of the buffer region 20 in the depth direction. Thus, VOH defects are formed in a wide range of the buffer region 20, and the doping concentration distribution is varied. Thus, an electric field may be locally concentrated in the buffer region 20, so that a short-circuit current tolerance decreases. In contrast, by reducing the half-value width of the helium chemical concentration peak 221, the short-circuit current tolerance can be easily maintained. Therefore, in the case of implanting either $^3$He or $^4$He, the acceleration energy E may be 20 MeV or less, or may be 10 MeV or less. Alternatively, the acceleration energy E of at least one or more or two or more helium chemical concentration peaks 221 of the plurality of helium chemical concentration peaks 221 may be equal to or less than 10 MeV, or may be equal to or less than 5 MeV.

Figure 5A:
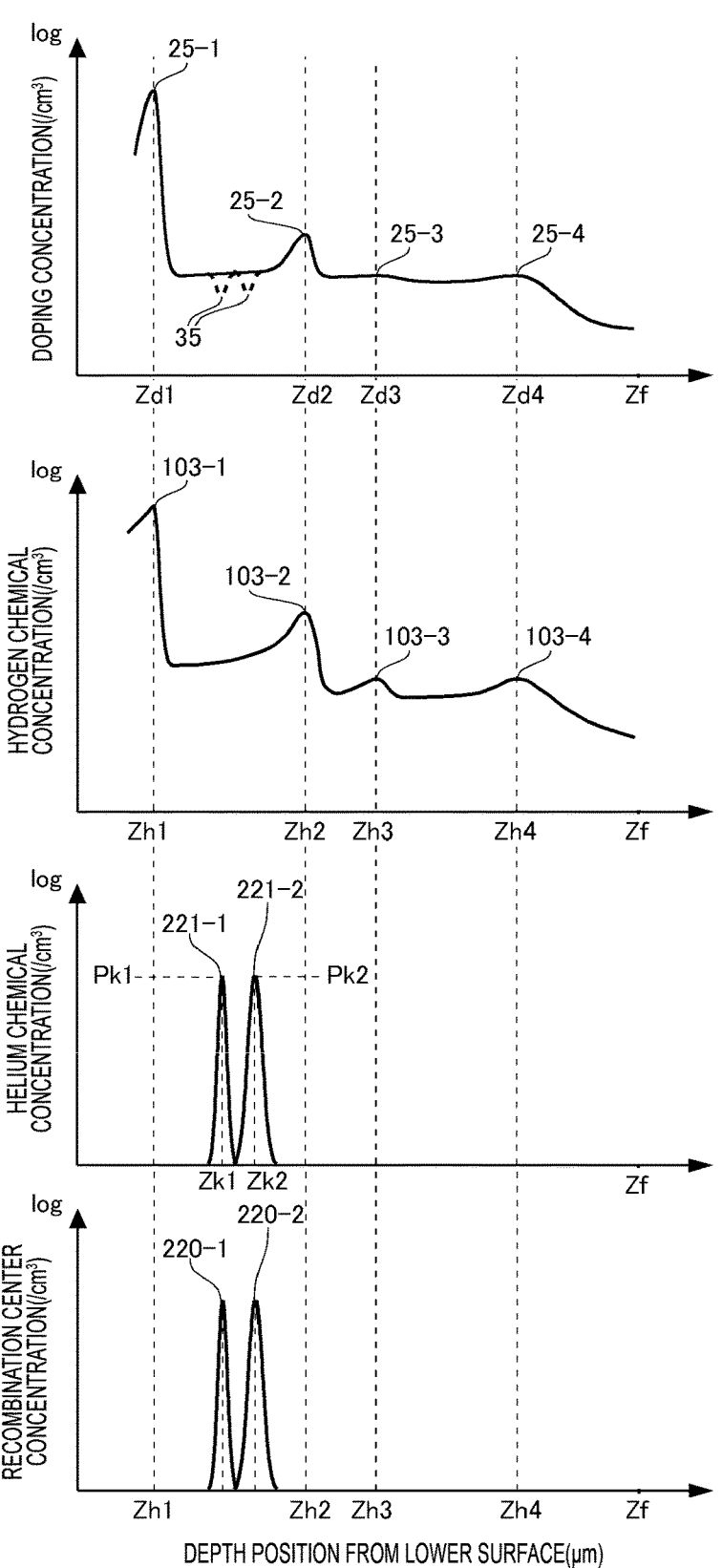
FIG. 5A illustrates a view showing an example of a doping concentration distribution, a hydrogen chemical concentration distribution, a helium chemical concentration distribution, and a recombination center concentration distribution in the buffer region 20.

FIG. 5A illustrates a view showing an example of the doping concentration distribution, the hydrogen chemical concentration distribution, the helium chemical concentration distribution, and the recombination center concentration distribution in the buffer region 20. The concentration distributions may be similar to respective concentration distributions described in FIG. 4A.

The doping concentration distribution of this example has the doping concentration peaks 25-1, 25-2, 25-3, and 25-4 in order from the lower surface 23 side of the semiconductor substrate 10. The doping concentration peak 25-4 is an example of the deepest doping concentration peak that is arranged farthest away from the lower surface 23. The depth positions of the doping concentration peaks 25 are set as Zd1, Zd2, Zd3, and Zd4 in order from the lower surface 23 side. Each depth position Zd indicates a distance from the lower surface 23. Note that any of the doping concentration peaks 25 may not be a clear peak. For example, an inflection point (kink) of the slope of the doping concentration distribution may be set as the doping concentration peak 25. The doping concentration peak 25-1 may be the doping concentration peak 25 having the largest concentration value. The doping concentration peak 25-2 may be the doping concentration peak 25 having the second largest concentration value. The doping concentration peak 25-3 may be the doping concentration peak 25 having the smallest concentration value. The doping concentration peak 25-4 may be the doping concentration peak 25 having a higher concentration than the doping concentration peak 25-3.

The hydrogen chemical concentration distribution of this example has hydrogen chemical concentration peaks 103-1, 103-2, 103-3, and 103-4 in order from the lower surface 23 side of the semiconductor substrate 10. The depth positions of the hydrogen chemical concentration peaks 103 are set as Zh1, Zh2, Zh3, and Zh4 in order from the lower surface 23 side. Each depth position Zh indicates a distance from the lower surface 23. A depth position Zdk may be the same position as a depth position Zhk. However, k is an integer of 1 to 4. The hydrogen chemical concentration peak 103-1 may be the hydrogen chemical concentration peak 103 having the largest concentration value. The hydrogen chemical concentration peak 103-2 may be hydrogen chemical concentration peak 103 having the second largest concentration value. The hydrogen chemical concentration peak 103-3 may be the hydrogen chemical concentration peak 103 having the smallest concentration value. The hydrogen chemical concentration peak 103-4 may be the hydrogen chemical concentration peak 103 having a higher concentration than the hydrogen chemical concentration peak 103-3.

The helium chemical concentration distribution of this example has the first helium chemical concentration peak 221-1 and the second helium chemical concentration peak 221-2 in order from the lower surface 23 side of the semiconductor substrate 10. The depth positions of the helium chemical concentration peaks 221 are set as Zk1 and Zk2 in order from the lower surface 23 side. Each depth position Zk indicates a distance from the lower surface 23. Further, the concentration values of the helium chemical concentration peaks 221 are set as Pk1 and Pk2 in order from the lower surface 23 side.

Two or more helium chemical concentration peaks 221 are arranged between the doping concentration peak 25-4, which is the deepest doping concentration peak, and the lower surface 23 of the semiconductor substrate 10. At least one helium chemical concentration peak 221 may be arranged between the depth positions Zd1 and Zd2. In this example, all helium chemical concentration peaks 221 are arranged between the depth positions Zd1 and Zd2. The full width at half maximum of the helium chemical concentration peak 221-2 may be larger than the full width at half maximum of the helium chemical concentration peak 221-1. The full width at half maximum of the helium chemical concentration peak 221-1 may be different from the full width at half maximum of the helium chemical concentration peak 221-2 depending on a difference in acceleration energy. In this example, a plurality of lower-surface-side lifetime killers 220 can be arranged in the vicinity of the collector region 22.

Figure 5B:
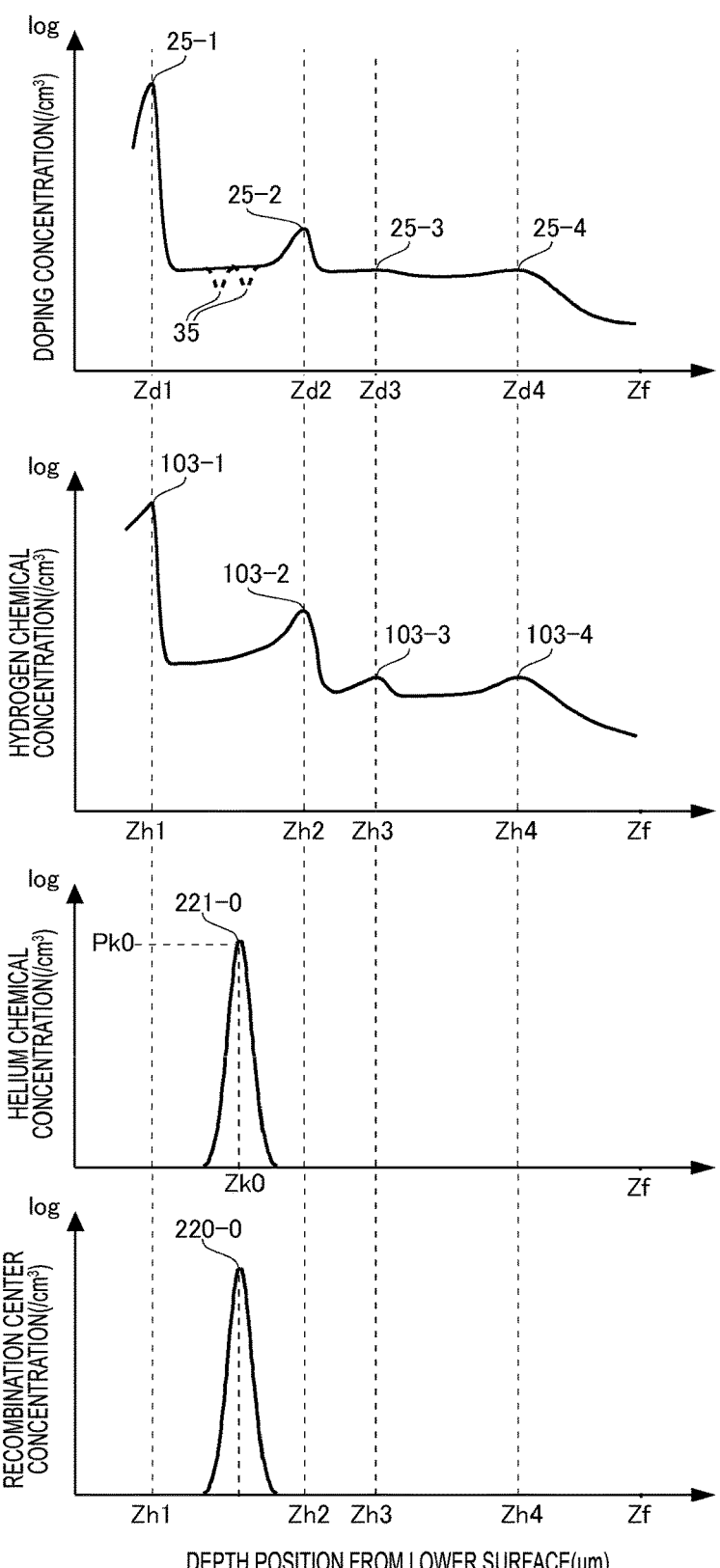
FIG. 5B illustrates a view showing an example of the doping concentration distribution, the hydrogen chemical concentration distribution, the helium chemical concentration distribution, and the recombination center concentration distribution in the buffer region 20.

FIG. 5B illustrates a view showing an example of the doping concentration distribution, the hydrogen chemical concentration distribution, the helium chemical concentration distribution, and the recombination center concentration distribution in the buffer region 20. In this example, the helium chemical concentration distribution and the recombination center concentration distribution are different from those in the example of FIG. 5A. Other distributions may be similar to those of the example of FIG. 5A.

The buffer region 20 of this example has one helium chemical concentration peak 221-0 and one lower-surface-side lifetime killer 220-0. The position of the helium chemical concentration peak 221-0 in the depth direction is set as Zk0, and the concentration is set as Pk0.

The depth position Zk0 of the helium chemical concentration peak 221-0 is arranged between the depth positions Zk1 and Zk2. A recombination center concentration peak (lower-surface-side lifetime killer 220-0) is arranged in the vicinity of the depth position Zk0. Further, the concentration Pk0 of the helium chemical concentration peak 221-0 may be higher than any of Pk1 and Pk2. The lower-surface-side lifetime killer 220-0 may also be higher in concentration than any of the lower-surface-side lifetime killers 220-1 and 220-2.

In the example of FIGS. 5A and 5B, when the depletion layer expanding from the lower end of the base region 14 reaches the lower-surface-side lifetime killer 220 at the time of turn-off or the like, the recombination center functions as the generation center of the carrier. With this configuration, a leakage current may increase, the heat generation of the semiconductor device may be promoted, the temperature of the semiconductor device may increase, and the tolerance of turn-off or the like may decrease. As in the example of FIG. 5A, the peak concentration of the helium chemical concentration (recombination center concentration) can be decreased by setting the plurality of lower-surface-side lifetime killers 220. With this configuration, the concentration of the generation center of the carrier can also be decreased, the leakage current can be reduced, the temperature rise of the semiconductor device can also be suppressed, and the tolerance of turn-off or the like can be increased. Further, the implantation of hole carriers from the collector region 22 into the drift region 18 can be suppressed.

Further, in the example of FIG. 5A, a distance (Zk2−Zk1) between the first helium chemical concentration peak 221-1 closest to the depth position Zd1 and the second helium chemical concentration peak 221-2 closest to the depth position Zd2 may be half or more of the distance (Zd2−Zd1). With this configuration, the plurality of lower-surface-side lifetime killers 220 can be arranged over a certain range. Further, an interval (Zk2−Zk1 in this example) between the helium chemical concentration peaks 221 adjacent to each other in the depth direction may be 2 m or more, may be 3 m or more, may be 4 m or more, or may be 5 m or more.

The concentration values Pk of the helium chemical concentration peaks 221 may be the same. In another example, any of the concentration values Pk may be different from the other concentration values Pk. The implantation dose amount of helium ions corresponding to each helium chemical concentration peak 221 may be $1 \times 10^{11} (/cm^2)$ or more, may be $3 \times 10^{11} (/cm^2)$ or more, or may be $1 \times 10^{12} (/cm^2)$ or more. The implantation dose amount of helium ions corresponding to each helium chemical concentration peak 221 may be $1 \times 10^{13} (/cm^2)$ or less, may be $3 \times 10^{12} (/cm^2)$ or less, or may be $1 \times 10^{12} (/cm^2)$ or less.

Each helium chemical concentration peak 221 may be arranged at a depth position different from that of any hydrogen chemical concentration peak 103. That is, the depth position Zk of the local maximum of each helium chemical concentration peak 221 does not fall within a range of the full width at half maximum of any hydrogen chemical concentration peak 103. With this configuration, the lifetime killer formed by helium implantation is suppressed from being terminated by hydrogen, and the concentration of the lower-surface-side lifetime killer 220 is easily maintained.

In each helium chemical concentration peak 221, the concentration value Pk may increase as a distance from the depth position Zh of the hydrogen chemical concentration peak 103 increases. With this configuration, it is possible to suppress the lifetime killer formed by helium implantation from forming VOH defects, and it is possible to suppress the variation in the shape of the doping concentration distribution in the buffer region 20.

When the carrier concentration distribution measured by the SRP method is a doping concentration distribution, the doping concentration distribution may have a valley portion 35 at the same depth position as that of any of the helium chemical concentration peaks 221. The valley portion 35 is a region where the doping concentration shows a local minimum value. In this example, since the lower-surface-side lifetime killer 220 is provided at the same depth position as that of the helium chemical concentration peak 221, the carrier mobility at this position decreases. With this configuration, the carrier concentration decreases as described above. In the following drawings showing the doping concentration distribution, the valley portion 35 is omitted at the same depth position as that of the helium chemical concentration peak 221, but the valley portion 35 may be provided.

Figure 6:
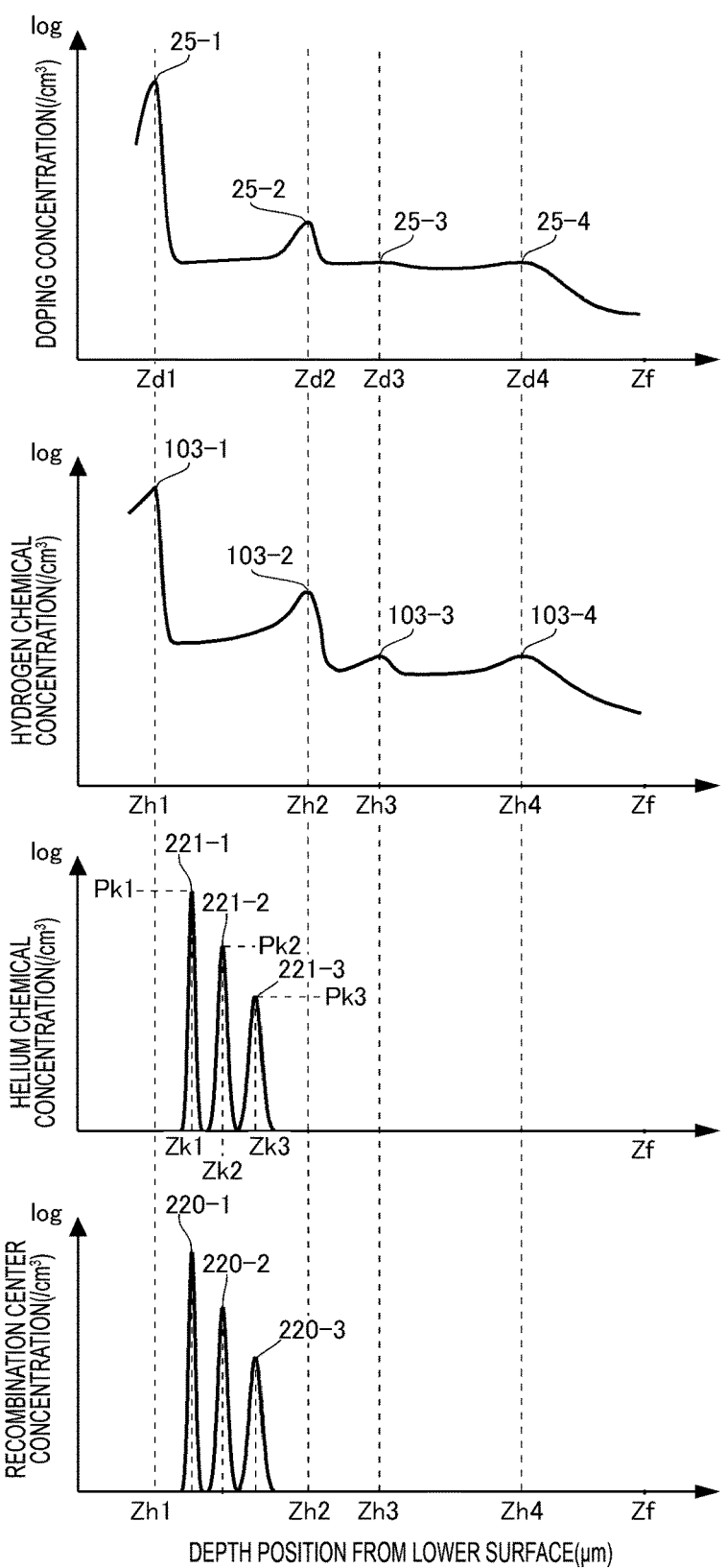
FIG. 6 illustrates a view showing another example of the helium chemical concentration distribution and the recombination center concentration distribution in the buffer region 20.

FIG. 6 illustrates a view showing another example of the helium chemical concentration distribution and the recombination center concentration distribution in the buffer region 20. The doping concentration distribution and the hydrogen chemical concentration distribution in FIG. 6 are the same as those in the example of FIG. 5A. The helium chemical concentration distribution in this example has the first helium chemical concentration peak 221-1, the second helium chemical concentration peak 221-2, and the third helium chemical concentration peak 221-3 in order from the lower surface 23 side of the semiconductor substrate 10. The depth positions of respective helium chemical concentration peaks 221 are set as Zk1, Zk2, and Zk3 in order from the lower surface 23 side. Further, the concentration values of the respective helium chemical concentration peaks 221 are set as Pk1, Pk2, and Pk3 in order from the lower surface 23 side. The recombination center concentration also has a distribution similar to that of the helium chemical concentration.

Also in this example, all helium chemical concentration peaks 221 are arranged between the depth positions Zd1 and Zd2. In another example, any of the helium chemical concentration peaks 221 may be arranged in another region of the buffer region 20.

The first helium chemical concentration peak 221-1 may have a higher concentration value Pk than at least one of the second helium chemical concentration peak 221-2 or the third helium chemical concentration peak 221-3. The first helium chemical concentration peak 221-1 may be the helium chemical concentration peak 221 with the largest concentration value Pk. Further, the concentration value Pk of the helium chemical concentration peak 221 may decrease as a distance from the lower surface 23 of the semiconductor substrate 10 increases. Further, the straggling ΔRp or the full width at half maximum of the helium chemical concentration peak 221 may increase as the distance from the lower surface 23 of the semiconductor substrate 10 increases.

The relative magnitude relationship of the concentrations of the respective lower-surface-side lifetime killers 220 may be the same as the relative magnitude relationship of the concentrations of the corresponding helium chemical concentration peaks 221. That is, the concentration of the lower-surface-side lifetime killer 220 may increase as the concentration of the corresponding helium chemical concentration peak 221 increases.

According to this example, the high-concentration lower-surface-side lifetime killer 220 is arranged in the vicinity of the lower surface 23. Thus, the implantation of hole carriers from the collector region 22 into the drift region 18 can be suppressed. Further, it is possible to suppress an increase in leakage current and to improve tolerance at the time of turn-off or the like.

Figure 7:
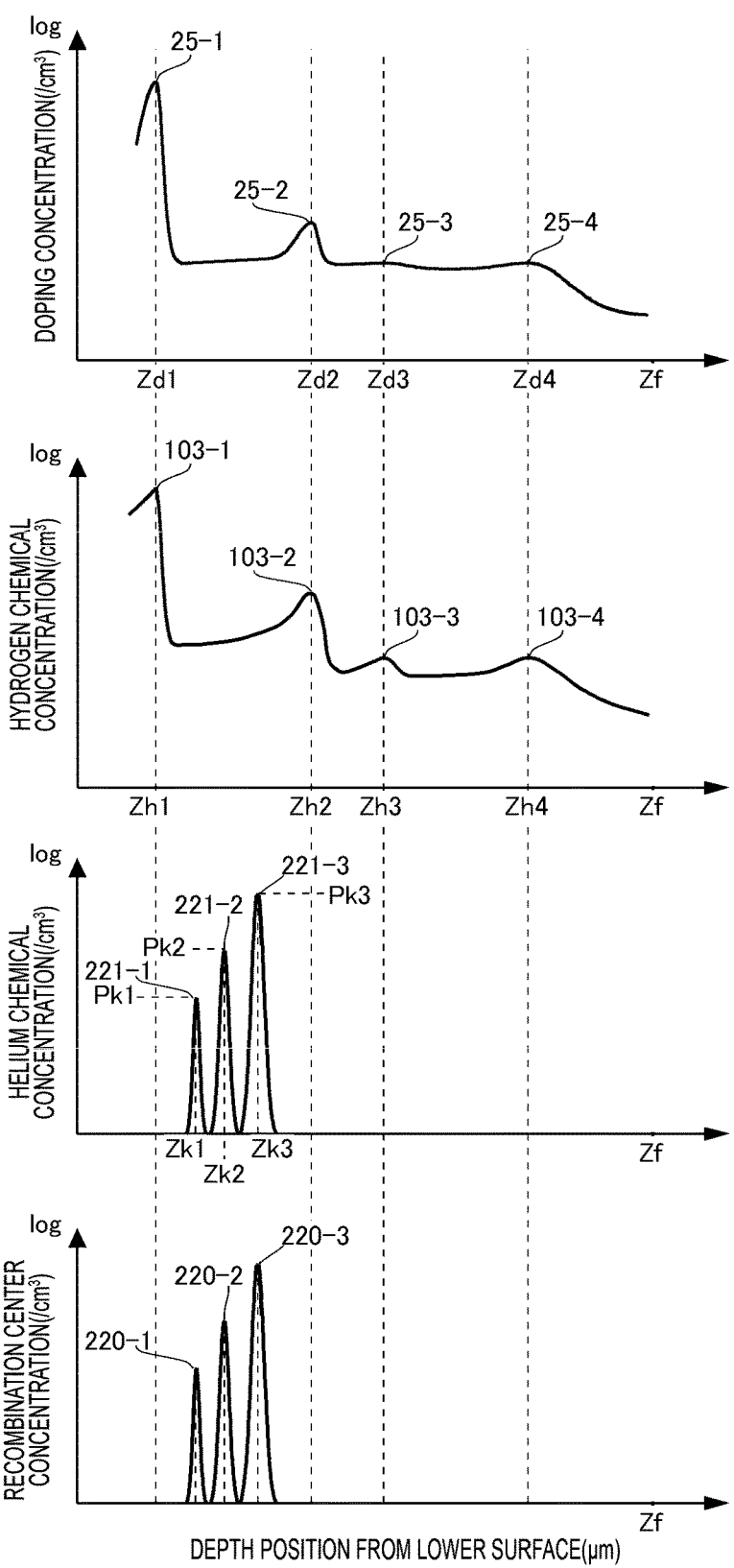
FIG. 7 illustrates a view showing still another example of the helium chemical concentration distribution and the recombination center concentration distribution in the buffer region 20.

FIG. 7 illustrates a view showing another example of the helium chemical concentration distribution and the recombination center concentration distribution in the buffer region 20. The doping concentration distribution and the hydrogen chemical concentration distribution in FIG. 7 are the same as those in the example of FIG. 5A. The helium chemical concentration distribution of this example is different from that of the example of FIG. 6 in the relative magnitude relationship of the concentrations of the respective helium chemical concentration peaks 221. The other structures are the same as those of the example in FIG. 6. The recombination center concentration also has a distribution similar to that of the helium chemical concentration.

The first helium chemical concentration peak 221-1 may have a lower concentration value Pk than at least one of the second helium chemical concentration peak 221-2 or the third helium chemical concentration peak 221-3. The first helium chemical concentration peak 221-1 may be the helium chemical concentration peak 221 with the smallest concentration value Pk. Further, the concentration value Pk of the helium chemical concentration peak 221 may increase as the distance from the lower surface 23 of the semiconductor substrate 10 increases. Further, the straggling ΔRp or the full width at half maximum of the helium chemical concentration peak 221 may increase as the distance from the lower surface 23 of the semiconductor substrate 10 increases.

According to this example, the high-concentration lower-surface-side lifetime killer 220 is arranged in the vicinity of the drift region 18. Thus, the lifetime of the carrier flowing from the drift region 18 to the lower surface 23 side can be shortened at the time of turning off the semiconductor device 100 or the like. Thus, a period during which the tail current flows can be shortened. Further, it is possible to suppress an increase in leakage current and to improve tolerance at the time of turn-off or the like.

Figure 8:
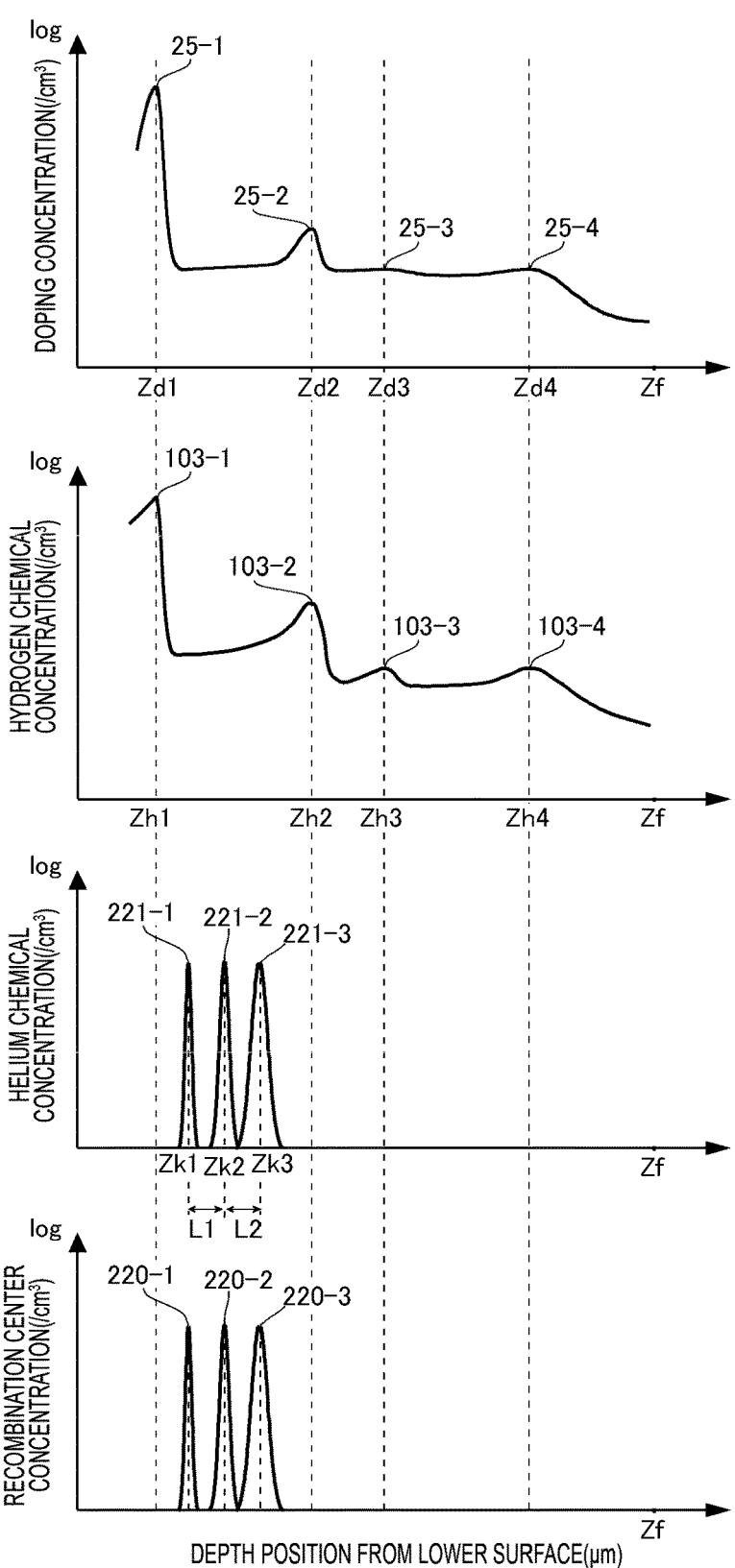
FIG. 8 illustrates a view showing still another example of the helium chemical concentration distribution and the recombination center concentration distribution in the buffer region 20.

FIG. 8 illustrates a view showing another example of the helium chemical concentration distribution and the recombination center concentration distribution in the buffer region 20. The doping concentration distribution and the hydrogen chemical concentration distribution in FIG. 8 are the same as those in the example of FIG. 5A. In this example, a peak interval between a helium chemical concentration peak 221-$k$ and a helium chemical concentration peak 221-($k$+1) in the depth direction is set as Lk (in FIG. 8, L1, L2). The other structures are the same as any of the examples described in FIGS. 5A to 7. The peak interval (in FIG. 8, L1, L2) between two helium chemical concentration peaks 221 adjacent in the depth direction may be uniform in the buffer region 20. The recombination center concentration also has a distribution similar to that of the helium chemical concentration.

Figure 9:
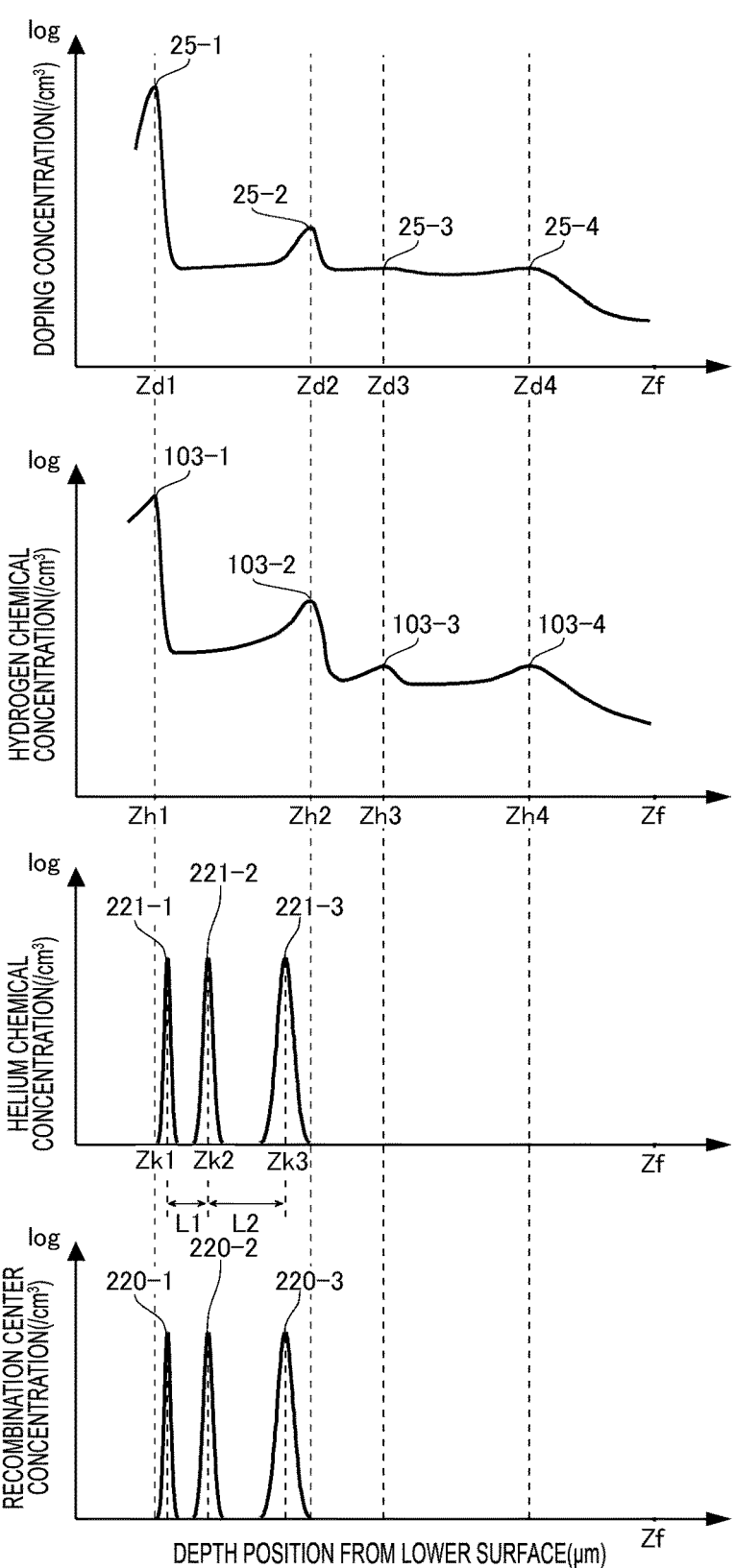
FIG. 9 illustrates a view showing still another example of the helium chemical concentration distribution and the recombination center concentration distribution in the buffer region 20.

FIG. 9 illustrates a view showing another example of the helium chemical concentration distribution and the recombination center concentration distribution in the buffer region 20. The doping concentration distribution and the hydrogen chemical concentration distribution in FIG. 9 are the same as those in the example of FIG. 5A. In this example, each peak interval Lk is different from that of the example of FIG. 8. The other structures are the same as those of the example in FIG. 8.

In this example, the first peak interval L1 is smaller than the second peak interval L2 at a position farther away from the lower surface 23 than the first peak interval L1 (L1<L2).

That is, in the buffer region 20, the helium chemical concentration peak 221 is arranged at a higher density toward the lower surface 23. The recombination center concentration also has a distribution similar to that of the helium chemical concentration.

According to this example, many lower-surface-side lifetime killers 220 can be formed in the vicinity of the collector region 22. Thus, the implantation of hole carriers from the collector region 22 into the drift region 18 can be suppressed.

Figure 10A:
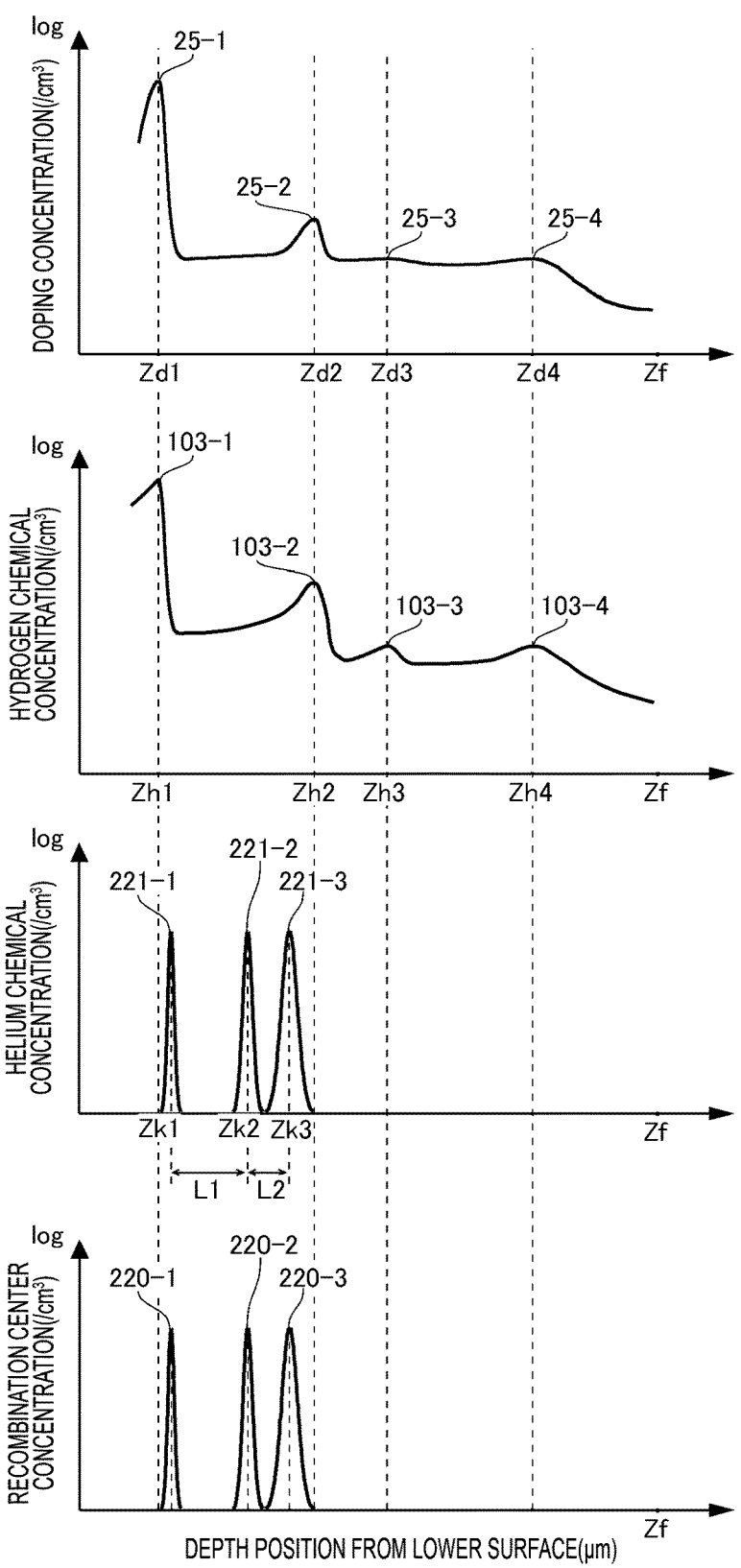
FIG. 10A illustrates a view showing still another example of the helium chemical concentration distribution and the recombination center concentration distribution in the buffer region 20.

FIG. 10A illustrates a view showing another example of the helium chemical concentration distribution and the recombination center concentration distribution in the buffer region 20. The doping concentration distribution and the hydrogen chemical concentration distribution in FIG. 10A are the same as those in the example of FIG. 5A. In this example, each peak interval Lk is different from that of the example of FIG. 8. The other structures are the same as those of the example in FIG. 8.

In this example, the first peak interval L1 is larger than the second peak interval L2 (L1>L2). That is, in the buffer region 20, the helium chemical concentration peak 221 is arranged at a higher density toward the drift region 18. The recombination center concentration also has a distribution similar to that of the helium chemical concentration.

According to this example, many lower-surface-side lifetime killers 220 can be formed in the vicinity of the drift region 18. Thus, the lifetime of the carrier flowing from the drift region 18 to the lower surface 23 side can be shortened at the time of turning off the semiconductor device 100 or the like. Thus, a period during which the tail current flows can be shortened.

Figure 10B:
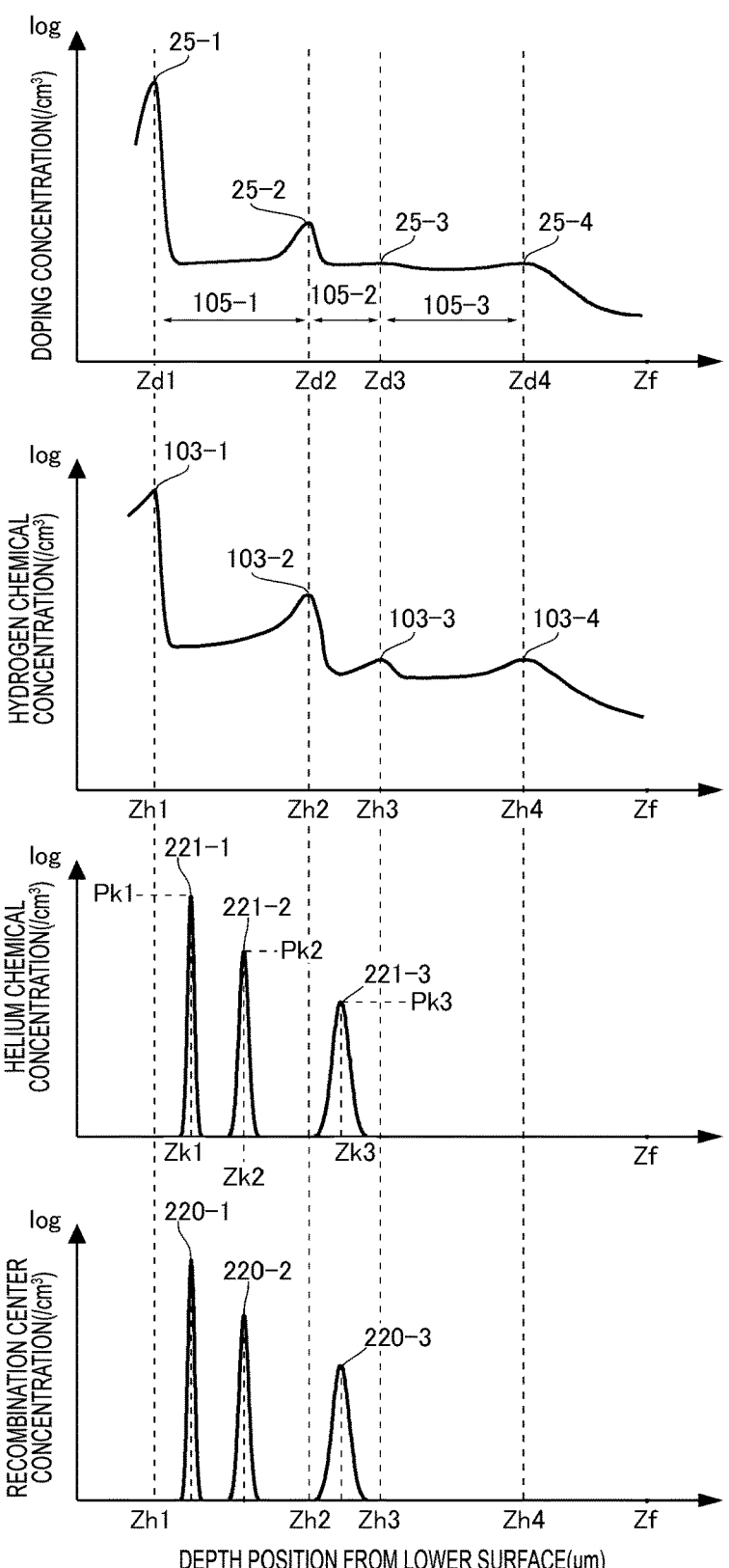
FIG. 10B illustrates a view showing still another example of the helium chemical concentration distribution and the recombination center concentration distribution in the buffer region 20.

FIG. 10B illustrates a view showing another example of the helium chemical concentration distribution and the recombination center concentration distribution in the buffer region 20. The doping concentration distribution and the hydrogen chemical concentration distribution in FIG. 10B are the same as those in the example of FIG. 5A.

A region between two doping concentration peaks 25 adjacent in the depth direction is set as an inter-peak region 105. A region between two hydrogen chemical concentration peaks 103 adjacent to each other in the depth direction may be set as the inter-peak region 105. In this example, a region between the depth positions Zd1 and Zd2 (or Zh1 and Zh2) is set as an inter-peak region 105-1, a region between the depth positions Zd2 and Zd3 (or Zh2 and Zh3) is set as an inter-peak region 105-2, and a region between the depth positions Zd3 and Zd4 (or Zh3 and Zh4) is set as an inter-peak region 105-3.

In this example, the helium chemical concentration peaks 221 are arranged in two or more inter-peak regions 105. The helium chemical concentration peak 221 may be arranged in two inter-peak regions 105 adjacent to each other. One or more helium chemical concentration peaks 221 may be arranged in each inter-peak region 105. More helium chemical concentration peaks 221 may be arranged closer to the lower surface 23 in the inter-peak region 105. In the example of FIG. 10B, two helium chemical concentration peaks 221 are arranged in the inter-peak region 105-1, and one helium chemical concentration peak 221 is arranged in the inter-peak region 105-2.

The magnitude relationship of the concentrations of the respective helium chemical concentration peaks 221 may be similar to that of any of the examples described in FIGS. 5A to 10A. In the example of FIG. 10B, the concentration of the helium chemical concentration peak 221 decreases as the distance from the lower surface 23 increases. The interval of the helium chemical concentration peaks 221 may be similar to that of any of the examples described in FIGS. 5A to 10A. The recombination center concentration may also have a distribution similar to that of the helium chemical concentration.

Figure 10C:
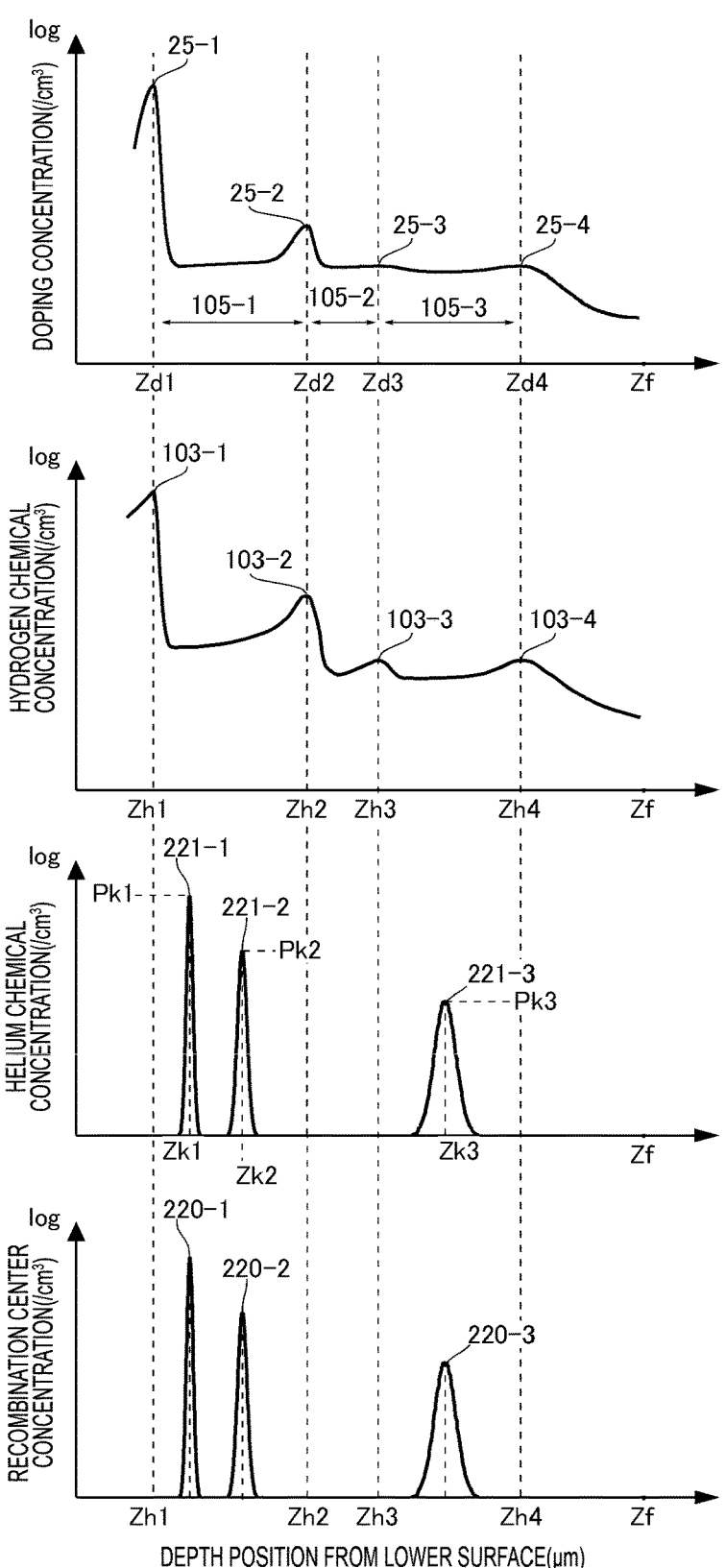
FIG. 10C illustrates a view showing still another example of the helium chemical concentration distribution and the recombination center concentration distribution in the buffer region 20.

FIG. 10C illustrates a view showing another example of the helium chemical concentration distribution and the recombination center concentration distribution in the buffer region 20. The doping concentration distribution and the hydrogen chemical concentration distribution in FIG. 10C are the same as those in the example of FIG. 5A.

In this example, the helium chemical concentration peak 221 is not arranged in the inter-peak region 105 between two inter-peak regions 105 where the helium chemical concentration peaks 221 are arranged. In the example of FIG. 10C, two helium chemical concentration peaks 221 are arranged in the inter-peak region 105-1, no helium chemical concentration peak 221 is arranged in the inter-peak region 105-2, and one helium chemical concentration peak 221 is arranged in the inter-peak region 105-3. The concentration of each helium chemical concentration peak 221 may be similar to that of the example of FIG. 10B. The recombination center concentration may also have a distribution similar to that of the helium chemical concentration.

Figure 10D:
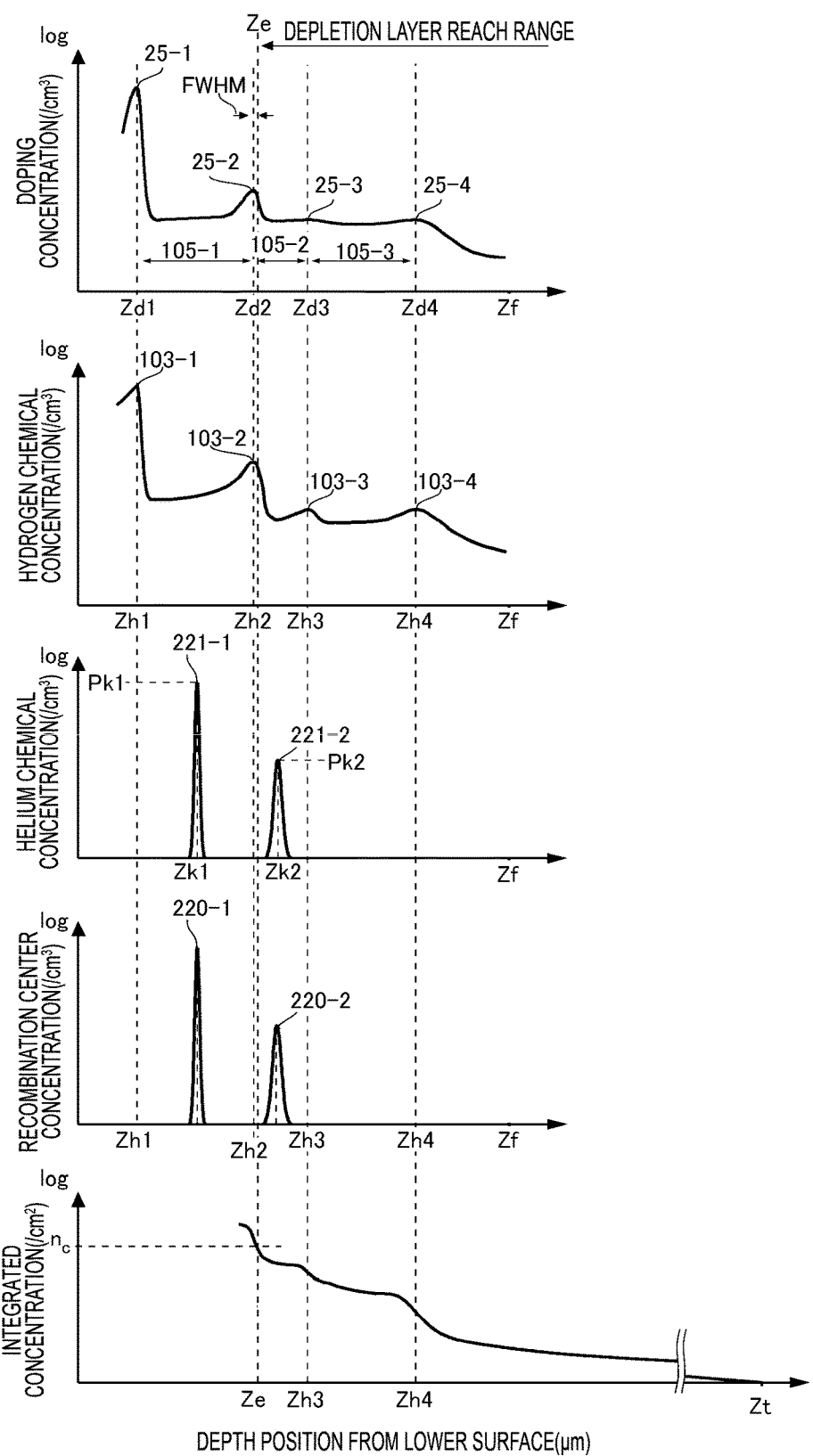
FIG. 10D illustrates a depletion layer edge position Ze included in the buffer region 20.

FIG. 10D illustrates a depletion layer edge position Ze included in the buffer region 20. FIG. 10D shows the doping concentration distribution, the hydrogen chemical concentration distribution, the helium chemical concentration distribution, the recombination center concentration distribution, and an integrated concentration distribution of the doping concentration in the buffer region 20. These distributions may be the same as or different from any of the distributions described in FIGS. 1 to 10 C. The doping concentration distribution and the hydrogen chemical concentration distribution shown in FIG. 10D are the same as those in FIG. 10B. The integrated concentration distribution of this example is a distribution of an integrated value (/cm$^2$) obtained by integrating the doping concentrations from the lower end position Zt of the trench portion toward the lower surface 23.

The depletion layer edge position Ze is a depth position at which the integrated concentration obtained by integrating the net doping concentrations of the drift region 18 and the buffer region 20 from the upper end of the drift region 18 toward the lower surface 23 of the semiconductor substrate 10 reaches a critical integrated concentration $n_c$. In the present specification, in a case where avalanche breakdown occurs due to a forward bias being applied between the collector electrode 24 and the emitter electrode 52, when depletion is caused from the upper end of the drift region 18 to a specific position of the buffer region 20, a value obtained by integrating the net doping concentrations from the upper end of the drift region 18 to the specific position is referred to as the critical integrated concentration. That is, the depletion layer edge position Ze is a position closest to the lower surface 23 side where the depletion layer expanding from the lower end of the base region 14 toward the lower surface 23 of the semiconductor substrate 10 reaches when the avalanche breakdown occurs. The critical integrated concentration $n_c$ depends on constituent atoms of the semiconductor substrate 10. When the semiconductor substrate 10 is formed of silicon, the critical integrated concentration $n_c$ is about $1.2 \times 10^{12}$/cm$^2$. When the rated voltage of the semiconductor device 100 is applied between the collector electrode 24 and the emitter electrode 52, the position closest to the lower surface 23 side where the depletion layer reaches may be set as the depletion layer edge position Ze.

By arranging the depletion layer edge position Ze in the buffer region 20, it is possible to prevent the depletion layer from reaching the collector region 22 or the cathode region 82.

Note that, the upper end of the drift region 18 is a boundary position between the drift region 18 and the accumulation region 16 in the example shown in FIG. 3. When it is difficult to determine the boundary position between the drift region 18 and the accumulation region 16, the lower end position Zt of the trench portion may be set as the lower end of the drift region 18. Further, when the drift region 18 and the base region 14 are in contact with each other, the position of the PN junction at the boundary between the drift region 18 and the base region 14 is the upper end of the drift region 18.

The buffer region 20 of this example has a first helium chemical concentration peak 221-1 and a second helium chemical concentration peak 221-2. Note that the first lower-surface-side lifetime killer 220-1 and the second lower-surface-side lifetime killer 220-2 are arranged at positions corresponding to the first helium chemical concentration peak 221-1 and the second helium chemical concentration peak 221-2.

The first helium chemical concentration peak 221-1 is arranged closer to the lower surface 23 side than the depletion layer edge position Ze. With this configuration, the first helium chemical concentration peak 221-1 can be arranged outside a range that the depletion layer reaches, so that the leakage current can be suppressed.

Further, the second helium chemical concentration peak 221-2 is arranged closer to the upper surface 21 side than the depletion layer edge position Ze. By providing the helium chemical concentration peaks 221 in a dispersed manner, it is possible to suppress the concentration of each peak from becoming excessively high. Thus, a current variation rate di/dt at the time of carrier disappearance can be made gentle, and the occurrence of a surge can be suppressed. Further, by providing the second helium chemical concentration peak 221-2, the carrier disappearance can be promoted at a timing earlier than when the depletion layer reaches the depletion layer edge position Ze. With this configuration, the current variation rate di/dt at the final stage of the reverse recovery operation such as a tail period can be made gentle, and the occurrence of the surge can be suppressed.

The concentration Pk1 of the first helium chemical concentration peak 221-1 may be higher than the concentration Pk2 of the second helium chemical concentration peak 221-2. By increasing the concentration of the first helium chemical concentration peak 221-1 arranged outside the reaching range of the depletion layer, the lifetime of the carrier can be shortened. Further, by reducing the concentration of the second helium chemical concentration peak 221-2 arranged inside the reaching range of the depletion layer, an increase in leakage current can be suppressed while adjusting the carrier lifetime. The concentration Pk1 may be 1.1 times or more, may be 1.5 times or more, may be 2 times or more, may be 5 times or more, or may be 10 times or more of the concentration Pk2.

The first helium chemical concentration peak 221-1 may be arranged in the inter-peak region 105-1 between the doping concentration peak 25-1 (first doping concentration peak) and the doping concentration peak 25-2 (second doping concentration peak). Further, the second helium chemical concentration peak 221-2 may also be arranged in the inter-peak region 105-2 between the doping concentration peak 25-2 (second doping concentration peak) and the doping concentration peak 25-3 (third doping concentration peak).

The full width at half maximum of the first helium chemical concentration peak 221-1 is smaller than the inter-peak region 105-1. The full width at half maximum of the first helium chemical concentration peak 221-1 may be half or less, may be 0.2 times or less, or may be 0.1 times or less of the inter-peak region 105-1. The full width at half maximum of the second helium chemical concentration peak 221-2 is smaller than the inter-peak region 105-2. The full width at half maximum of the second helium chemical concentration peak 221-2 may be half or less, may be 0.2 times or less, or may be 0.1 times or less of the inter-peak region 105-2.

The respective helium chemical concentration peaks 221 may not overlap. The fact that the helium chemical concentration peaks 221 overlap may indicate that the depth ranges of the full width at half maximum of the respective peaks overlap.

Note that, the distribution of the lower-surface-side lifetime killer 220 may be similar to the distribution of the helium chemical concentration peak 221. The description regarding the concentration, shape, arrangement, and the like of the helium chemical concentration peak 221 described in the present specification can also be applied to the lower-surface-side lifetime killer 220.

The depletion layer edge position Ze may be arranged in the range of the full width at half maximum FWHM of the doping concentration peak 25-2. Accordingly, it is possible to suppress the depletion layer from reaching the lower side below the buffer region 20.

Figure 10E:
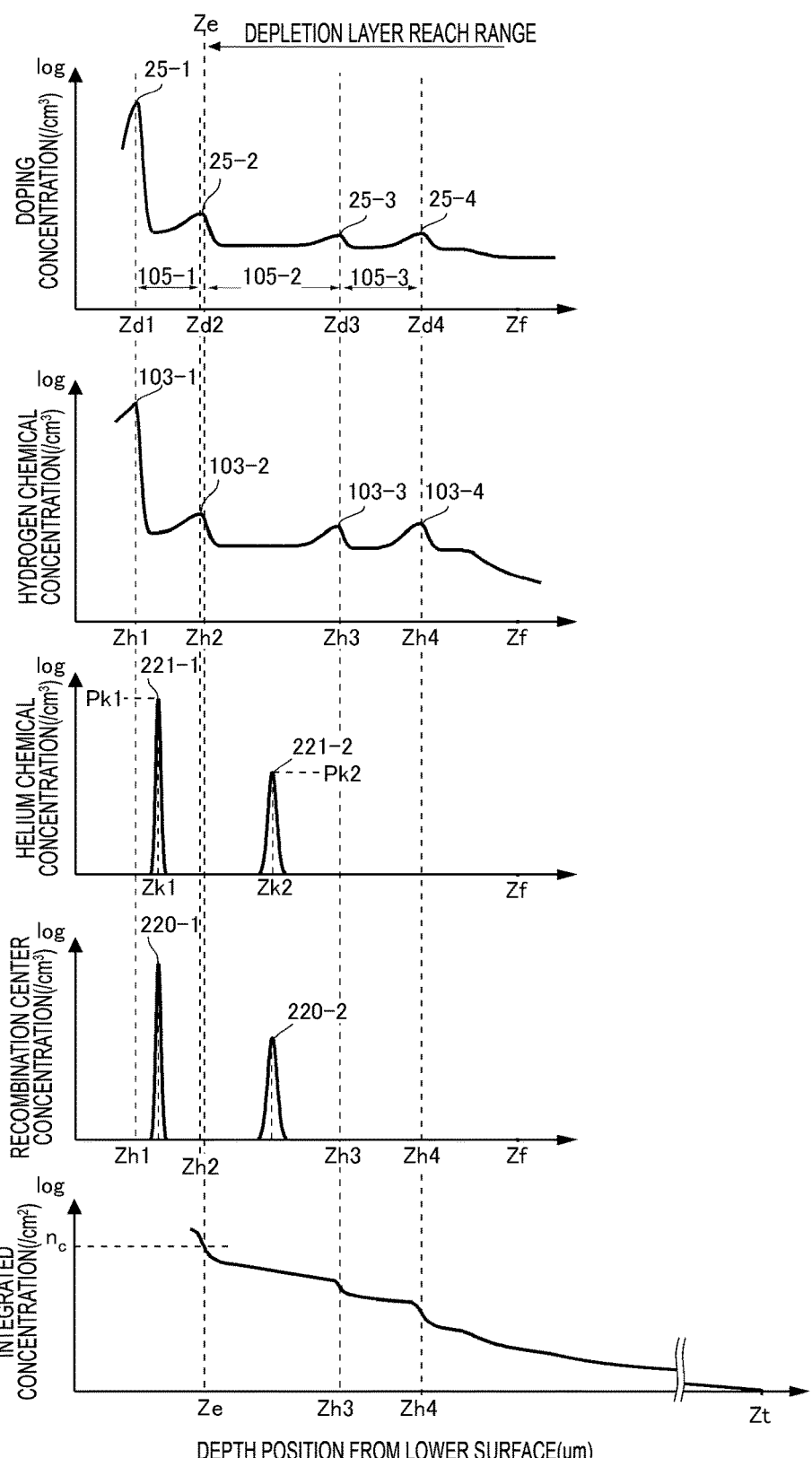
FIG. 10E illustrates a view showing still another example of the doping concentration distribution, the hydrogen chemical concentration distribution, and an integrated concentration distribution in the buffer region 20.

FIG. 10E illustrates a view showing another example of the doping concentration distribution, the hydrogen chemical concentration distribution, and the integrated concentration distribution in the buffer region 20. The helium chemical concentration distribution and the recombination center concentration distribution in FIG. 10E are similar to those of any of the examples described in FIGS. 1 to 10D. FIG. 10E shows the helium chemical concentration distribution and the recombination center concentration distribution similar to those of the example of FIG. 10D.

In the doping concentration distribution shown in FIG. 10D, the inter-peak region 105-1 is larger than the inter-peak region 105-2. In the doping concentration distribution shown in FIG. 10E, the inter-peak region 105-2 is larger than the inter-peak region 105-1. The other structures of the doping concentration distribution are similar to those of any of the examples described in FIGS. 1 to 10D. Also in this example, the depletion layer edge position Ze may be arranged within the full width at half maximum of the doping concentration peak 25-2.

Figure 10F:
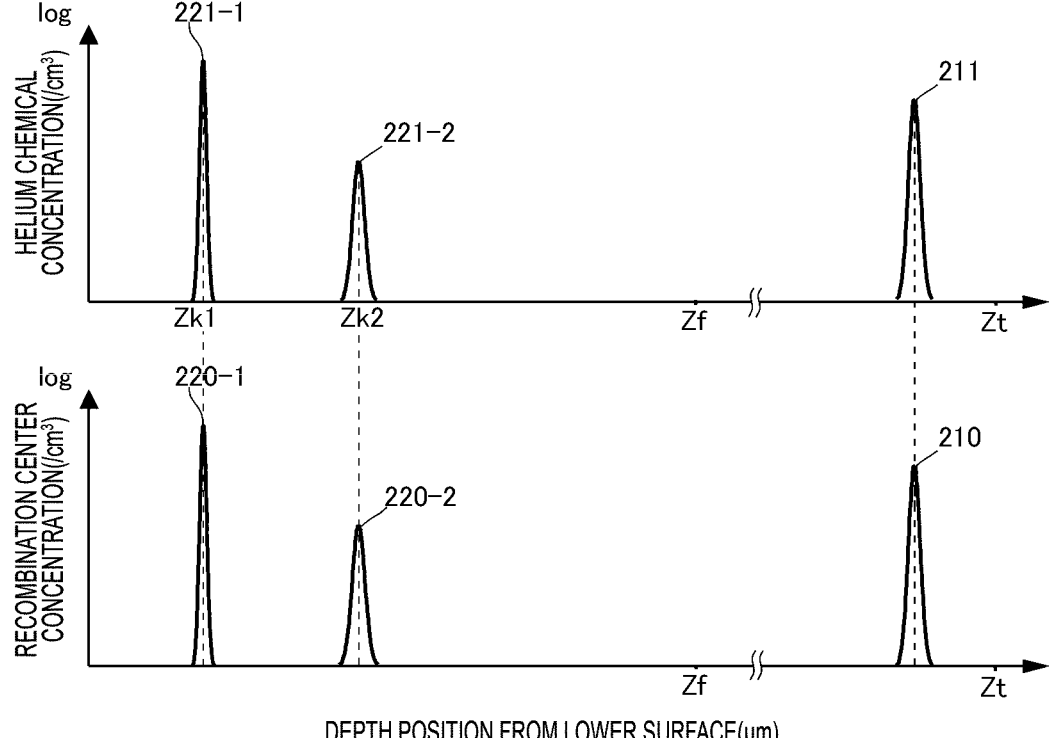
FIG. 10F illustrates a view showing an example of an upper-surface-side lifetime killer 210 and a lower-surface-side lifetime killer 220.

FIG. 10F illustrates a view showing an example of the upper-surface-side lifetime killer 210 and the lower-surface-side lifetime killer 220. In FIG. 10F, the helium chemical concentration peak 211 corresponding to the upper-surface-side lifetime killer 210 and the helium chemical concentration peak 221 corresponding to the lower-surface-side lifetime killer 220 are shown together. The distributions of the lower-surface-side lifetime killer 220 and the helium chemical concentration peak 221 are similar to those of any of the examples described in FIGS. 1 to 10E.

As described in FIG. 3, the upper-surface-side lifetime killer 210 is arranged on the upper surface 21 side of the semiconductor substrate 10. The upper-surface-side lifetime killer 210 may be arranged closer to the upper surface 21 side than the center in the depth direction of the semiconductor substrate 10. The upper-surface-side lifetime killer 210 may be arranged closer to the upper surface 21 side than the center in the depth direction of the drift region 18. Although the upper-surface-side lifetime killer 210 is provided in the diode portion 80 in FIG. 3, the upper-surface-side lifetime killer 210 may be provided in at least a part of the region of the transistor portion 70. The distribution example shown in FIG. 10F may be a distribution example in the diode portion 80 or may be a distribution example in the transistor portion 70.

Figure 10G:
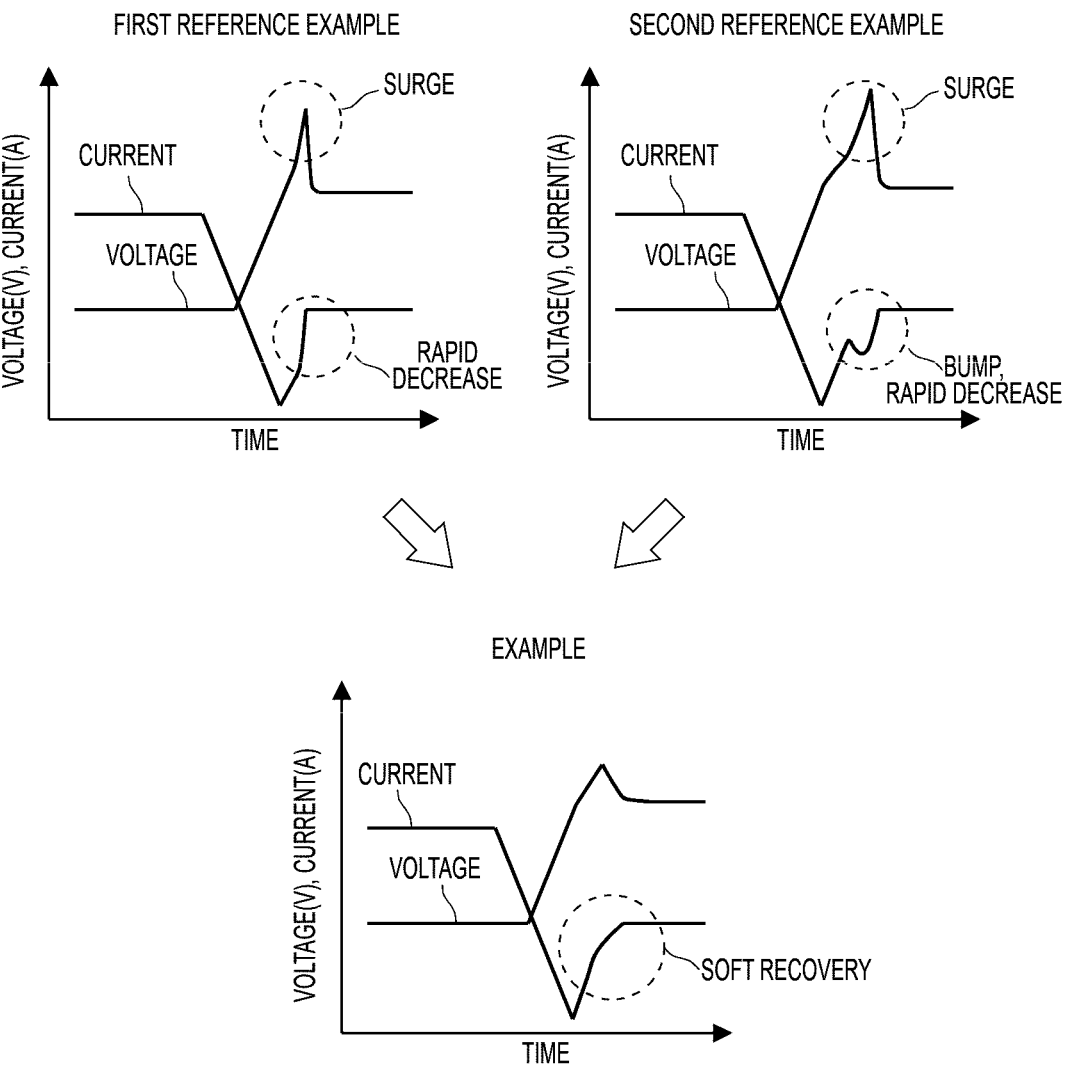
FIG. 10G illustrates a view showing an example of a voltage waveform and a current waveform in a diode portion 80.

FIG. 10G illustrates a view showing an example of a voltage waveform and a current waveform in the diode portion 80. FIG. 10G shows a waveform of a voltage applied between the emitter electrode 52 and the collector electrode 24 and a waveform of a current flowing between the emitter electrode 52 and the collector electrode 24. FIG. 10G shows waveforms in a first reference example, a second reference example, and the present example when the diode portion 80 is turned off. In the first reference example and the second reference example, only one helium chemical concentration peak is provided in the buffer region 20. In the present example, as shown in FIG. 10D or FIG. 10E, one helium chemical concentration peak is provided in each of the buffer region 20 that is closer to the lower surface 23 side than the depletion layer edge position Ze and the buffer region 20 that is closer to the upper surface 21 side than the depletion layer edge position Ze.

In the first reference example, the concentration of the helium chemical concentration peak (that is, the recombination center concentration) is larger than that in the second reference example. In this case, a current rapidly decreases at the timing when the depletion layer reaches the helium chemical concentration peak during the reverse recovery. Thus, a surge occurs in the voltage waveform. In the second reference example, the recombination center concentration is small, and thus many carriers remain until the final stage of the reverse recovery operation. Thus, in the second reference example, a current bump occurs at the final stage of the reverse recovery operation, and the current decreases rapidly. Thus, a surge occurs in the voltage waveform.

In contrast, in the present example, by providing the plurality of helium chemical concentration peaks 221, the concentration of each peak can be suppressed and the occurrence of the surge can be suppressed. Further, by providing the second helium chemical concentration peak 221-2, carrier disappearance can be promoted at an early timing, the occurrence of current bumps at the final stage of the reverse recovery can be suppressed, and the occurrence of voltage surges can be suppressed.

Figure 11:
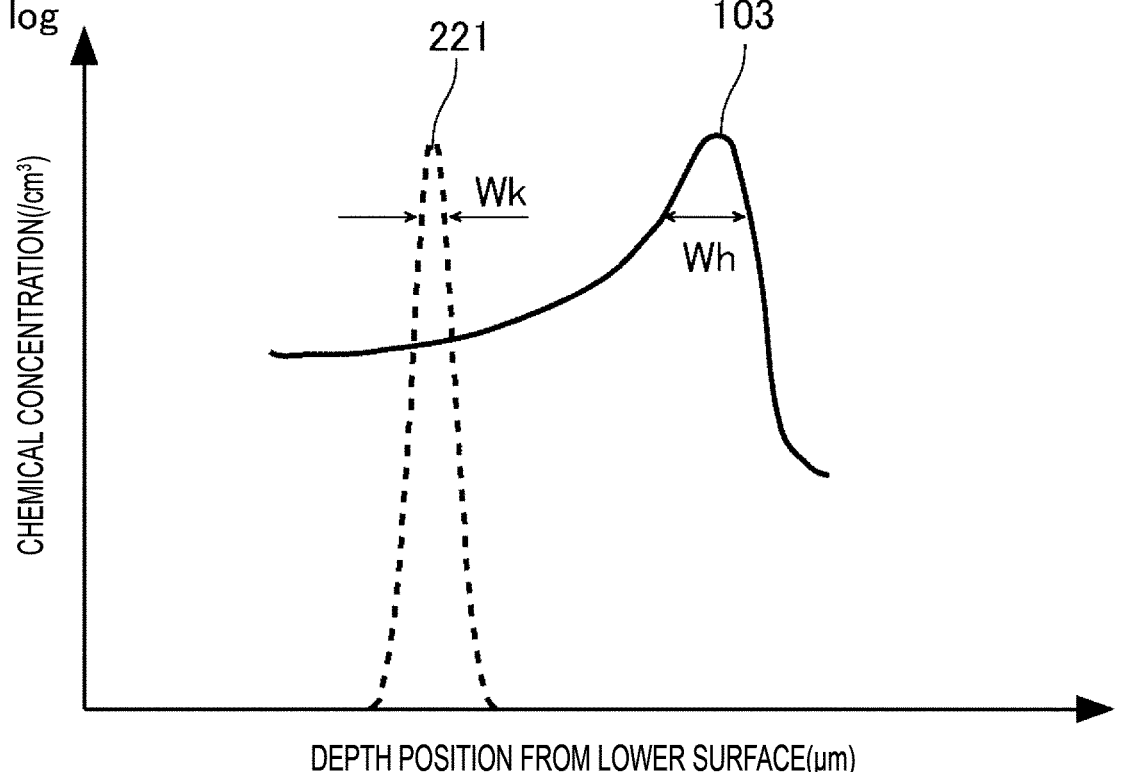
FIG. 11 illustrates a full width at half maximum Wk of a helium chemical concentration peak 221.

FIG. 11 illustrates the full width at half maximum Wk of the helium chemical concentration peak 221. In this example, the full width at half maximum of the hydrogen chemical concentration peak 103 is set as Wh. In FIG. 11, only one helium chemical concentration peak 221 and one hydrogen chemical concentration peak 103 are shown, and illustration of the other peaks are omitted.

The full width at half maximum Wk of each helium chemical concentration peak 221 is smaller than the full width at half maximum Wh of any hydrogen chemical concentration peak 103 arranged farther away from the lower surface 23 of the semiconductor substrate than each helium chemical concentration peak 221. For example, the full width at half maximum of each of the helium chemical concentration peaks 221-1, 221-2, and 221-3 shown in FIG. 10A is smaller than the full width at half maximum of any of the hydrogen chemical concentration peaks 103-2, 103-3, and 103-4. Each full width at half maximum Wk may be equal to or less than half of the full width at half maximum Wh of the hydrogen chemical concentration peak 103 farther away from lower surface 23. By reducing the full width at half maximum Wk of the helium chemical concentration peak 221, it is possible to suppress a change in the shape of the doping concentration distribution of the buffer region 20 over a wide range.

Figure 12A:
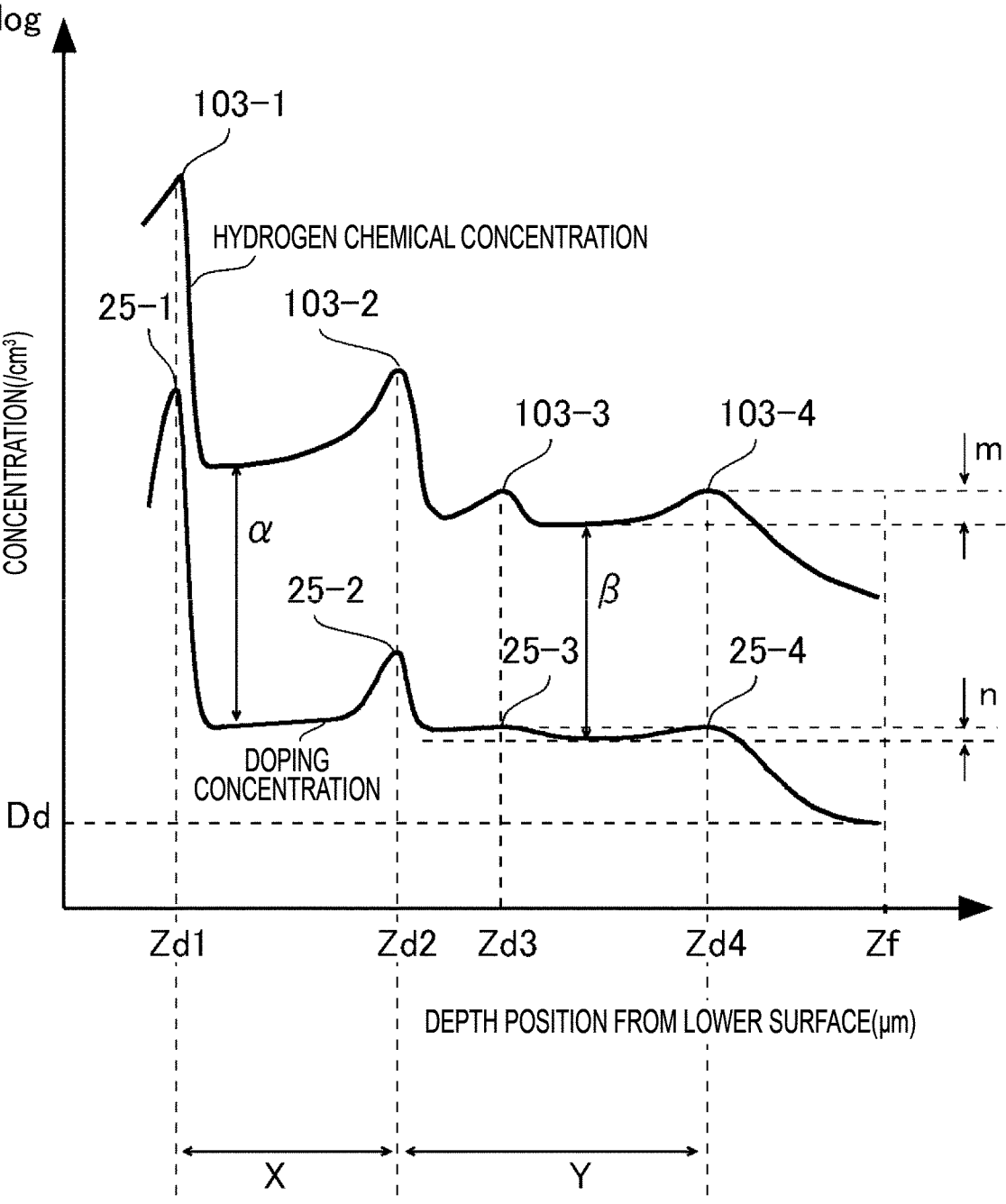
FIG. 12A illustrates a view showing an example of the doping concentration distribution and the hydrogen chemical concentration distribution in the buffer region 20.

FIG. 12A illustrates a view showing an example of the doping concentration distribution and the hydrogen chemical concentration distribution in the buffer region 20. The doping concentration distribution and the hydrogen chemical concentration distribution may be similar to those in the examples described in FIGS. 5A to 11. Further, the helium chemical concentration distribution is the same as that of any of the examples described in FIGS. 5A to 11.

In this example, the two doping concentration peaks 25-3 and 25-4 farthest away from the lower surface 23 of the semiconductor substrate 10 are not observed as clear concentration peaks. A ratio of the minimum value of the doping concentration in the region between the doping concentration peak 25-3 and the doping concentration peak 25-4 to the larger one of the concentration values of the doping concentration peak 25-3 and the doping concentration peak 25-4 is set as n. The ratio n may be 50% or less, may be 20% or less, or may be 10% or less.

Further, a ratio of the minimum value of the hydrogen chemical concentration in the region between the hydrogen chemical concentration peak 103-3 and the hydrogen chemical concentration peak 103-4 to the larger one of the concentration values of two hydrogen chemical concentration peaks 103-3 and 103-4 farthest away from lower surface 23 of semiconductor substrate 10 is set as m. The ratio m may be larger than the ratio n. That is, in a range from the depth position Zd3 to Zd4, the amplitude of a fluctuation in the hydrogen chemical concentration distribution may be larger than the amplitude of a fluctuation in the doping concentration distribution.

Further, a region from the depth position Zd1 to the depth position Zd2 is set as a region X, and a region from the depth position Zd2 to the depth position Zd4 is set as a region Y. In the region X, a ratio of the minimum value of the hydrogen chemical concentration to the minimum value of the doping concentration is set as a. Similarly, in the region Y, a ratio of the minimum value of the hydrogen chemical concentration to the minimum value of the doping concentration is set as 3. The ratio $\alpha$ may be larger than the ratio 3. Further, in the depth direction, the region Y may be longer than the region X. The length of the region Y may be 1.5 times or more, or may be 2 times or more of the length of the region X.

Figure 12B:
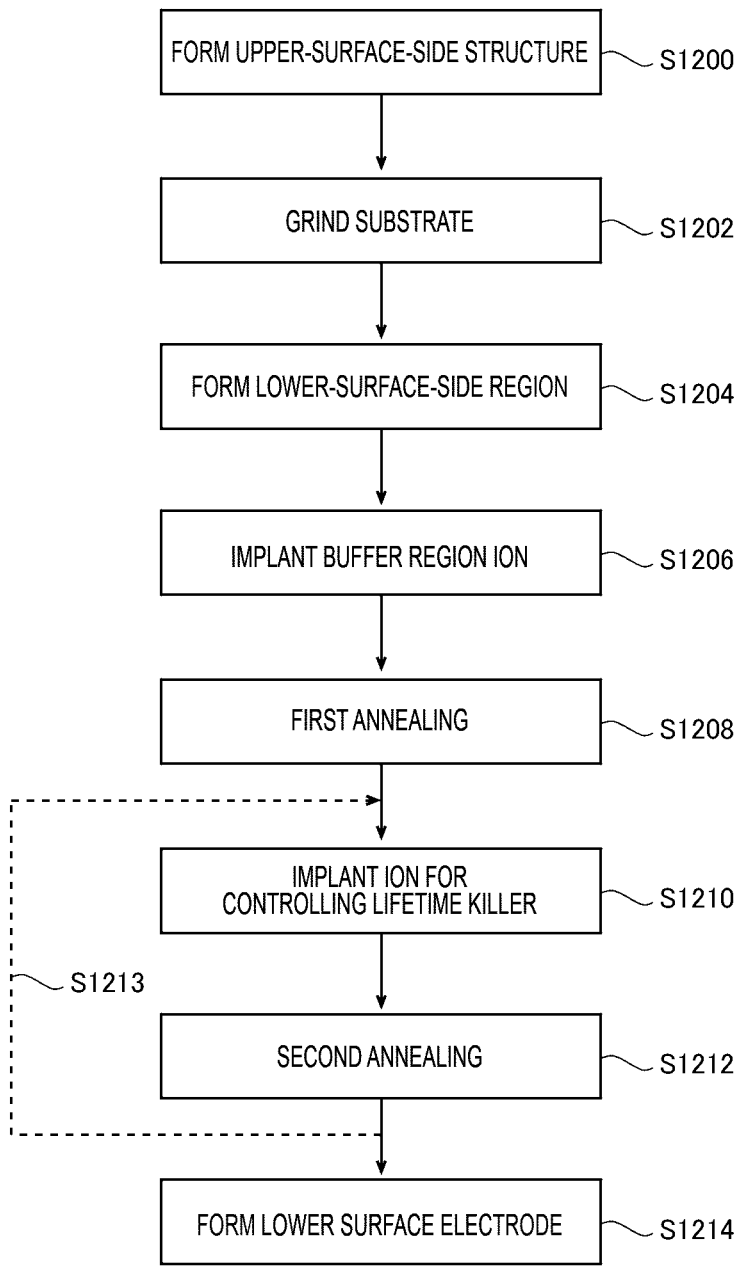
FIG. 12B illustrates some processes in a manufacturing method of the semiconductor device 100.

FIG. 12B illustrates some processes in a manufacturing method of the semiconductor device 100. In this example, in an upper-surface-side structure forming step S1200, the structure on the upper surface 21 side of the semiconductor substrate 10 is formed. The structure on the upper surface 21 side may include at least one of doped regions, such as the emitter region 12, the base region 14, and the accumulation region 16, on the upper surface 21 side of the semiconductor substrate 10. The structure on the upper surface 21 side may include each trench portion. The structure on the upper surface 21 side may include a structure above the upper surface 21 of the semiconductor substrate 10, such as the emitter electrode 52. The structure on the upper surface 21 side may include the edge termination structure portion 90.

Next, in a substrate grinding step S1202, the lower surface 23 of the semiconductor substrate 10 is ground to thin the semiconductor substrate 10. In S1202, the semiconductor substrate 10 may be thinned to a thickness corresponding to the breakdown voltage to be possessed by the semiconductor device 100.

Next, in a lower-surface-side region forming step S1204, the lower surface doped region of the semiconductor substrate 10 is formed. The lower surface doped region is a doped region in contact with an electrode, such as the collector electrode 24 formed in a later process, formed on the lower surface 23. The lower surface doped region may include at least one of the cathode region 82 or the collector region 22.

Next, in a first ion implantation step S1206, ions for forming the buffer region 20 are implanted into the semiconductor substrate 10. In S1206, ions may be implanted from the lower surface 23 of the semiconductor substrate 10 into a region where the buffer region 20 is to be formed. In S1206, donor ions such as hydrogen ions (for example, protons) or phosphorous ions may be implanted.

Next, in a first annealing step S1208, the semiconductor substrate 10 is thermally annealed. In S1208, the semiconductor substrate 10 may be put into an electric furnace to anneal the entire semiconductor substrate 10 (or a wafer). The annealing temperature in S1208 may be 320 degrees C. or higher and 420 degrees C. or lower. In S1208, annealing may be performed in an atmosphere containing hydrogen and nitrogen.

Next, in a second ion implantation step S1210, ions for forming the lower-surface-side lifetime killer 220 are implanted into the semiconductor substrate 10. In S1210, ions may be implanted from the lower surface 23 of the semiconductor substrate 10. In S1210, hydrogen ions such as protons, or helium ions may be implanted. In this example, helium ions are implanted.

In S1210, the lower-surface-side lifetime killer 220 described in FIGS. 5A to 10G is formed. The lower-surface-side lifetime killers 220 can be formed at a plurality of positions in the depth direction by sequentially changing the acceleration energy of helium ions or the like. In S1210, helium ions or the like may be implanted in order from a position closer to the lower surface 23 among the plurality of positions in the depth direction, or helium ions or the like may be implanted in order from a position farther from the lower surface 23. In this example, helium ions are implanted in order from a position farther from the lower surface 23. Further, in S1210, ions may be implanted in order from the lower-surface-side lifetime killer 220 having a larger dose amount, or ions may be implanted in order from the lower-surface-side lifetime killer 220 having a smaller dose amount.

Next, in the second annealing step S1212, the semiconductor substrate 10 is thermally annealed. In S1212, the semiconductor substrate 10 may be put into an electric furnace to anneal the entire semiconductor substrate 10 (or a wafer). The annealing temperature in S1212 may be lower than the annealing temperature in S1208. The annealing temperature in S1212 may be 300 degrees C. or higher and 400 degrees C. or lower. In S1212, annealing may be performed in a nitrogen atmosphere or an atmosphere containing hydrogen and nitrogen.

S1212 may be performed each time helium ions or the like are implanted into one depth position in S1210, or may be performed each time helium ions or the like are implanted into a plurality of depth positions. A set of processes of S1210 and S1212 may be repeated a plurality of times (S1213).

Next, in a lower surface electrode forming step S1214, an electrode in contact with the lower surface 23 is formed. In S1214, the collector electrode 24 may be formed. Through such a process, the semiconductor device 100 can be formed.

Figure 13:
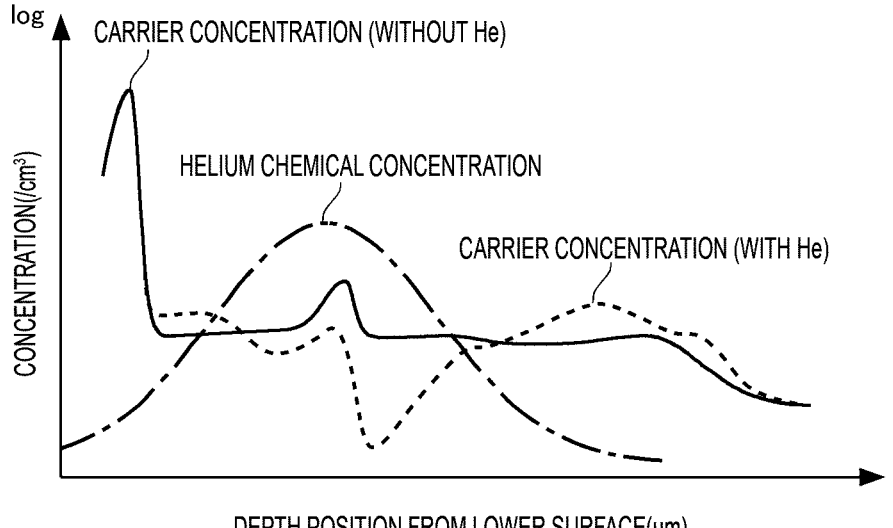
FIG. 13 shows an example of a carrier concentration distribution and a helium chemical concentration distribution in the buffer region 20 of a comparative example.

FIG. 13 shows an example of the carrier concentration distribution and the helium chemical concentration distribution in the buffer region 20 of a comparative example. The buffer region 20 of this example has only one peak of helium chemical concentration formed by implanting $^3$He. Further, in FIG. 13, the carrier concentration distribution when helium is not implanted is indicated by a solid line, and the carrier concentration distribution when helium is implanted is indicated by a broken line. The carrier concentration distribution when helium is not implanted is similar to the doping concentration distribution in FIG. 5A or the like.

In this example, a single helium chemical concentration peak is provided in the buffer region 20. Thus, it is difficult to control the distribution of the lifetime killer. Further, when the half-value width of the helium chemical concentration peak is large, the carrier concentration distribution varies in a wider range as compared with a case where helium is not implanted. In contrast, in the example of FIGS. 1 to 12B, since the plurality of helium chemical concentration peaks are arranged in the buffer region 20, the distribution of the lifetime killer can be adjusted precisely. Further, by reducing the half-value width of the helium chemical concentration peak, it is possible to suppress the variation in the carrier concentration distribution in a wide range.

Second Example

Figure 14:
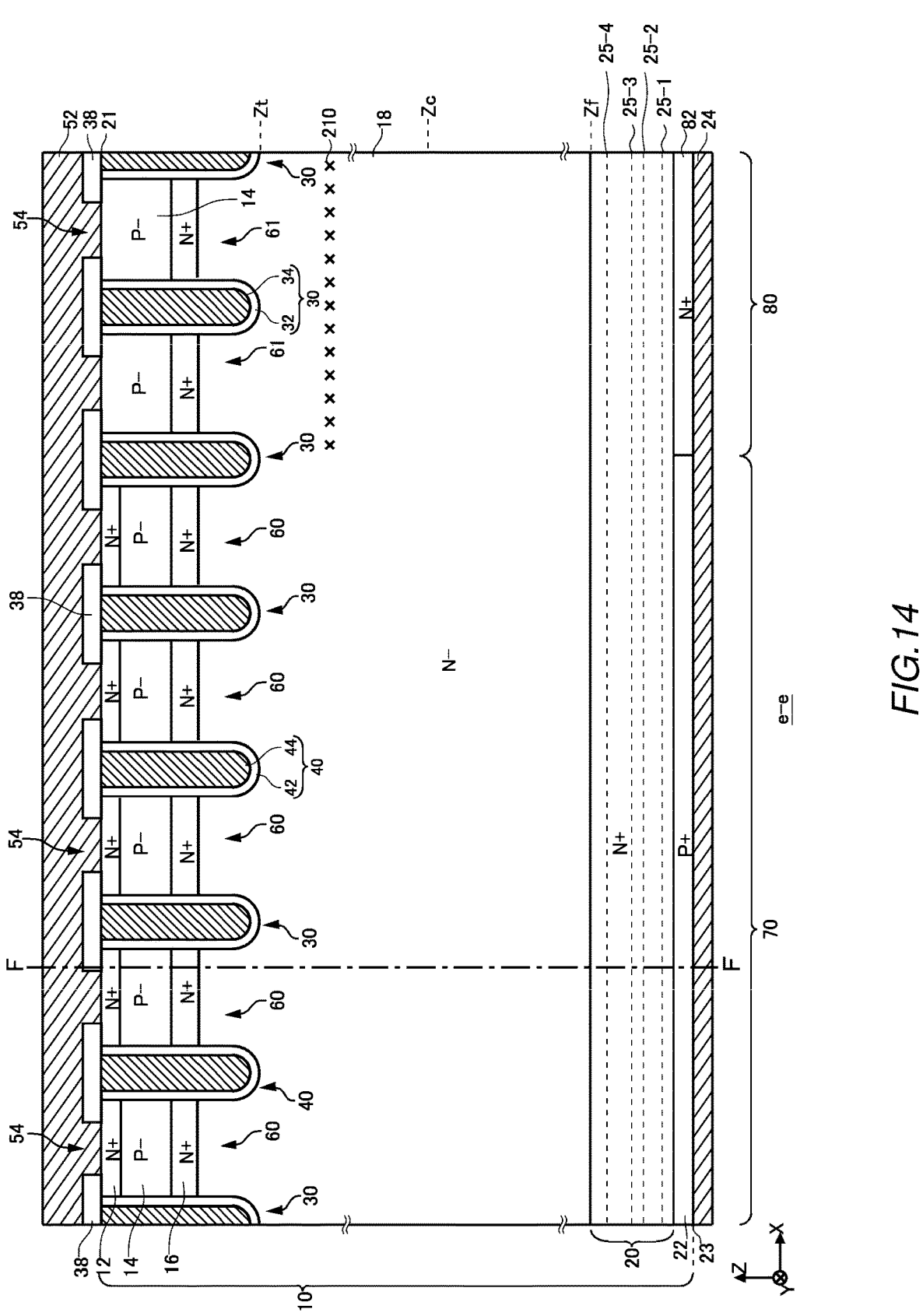
FIG. 14 illustrates a view showing another example of the cross section e-e.

FIG. 14 illustrates a view showing another example of the cross section e-e. In the semiconductor device 100 of this example, the method of forming the buffer region 20 is different from that of the first example described in FIGS. 1 to 13. The method of forming the buffer region 20 will be described below. The other portions are similar to those in the first example. Note that in the semiconductor device 100 of this example, the lower-surface-side lifetime killer 220 may be provided in the buffer region 20, or may not be provided. That is, the helium chemical concentration peak 221 may be provided in the buffer region 20, or may not be provided.

Figure 15:
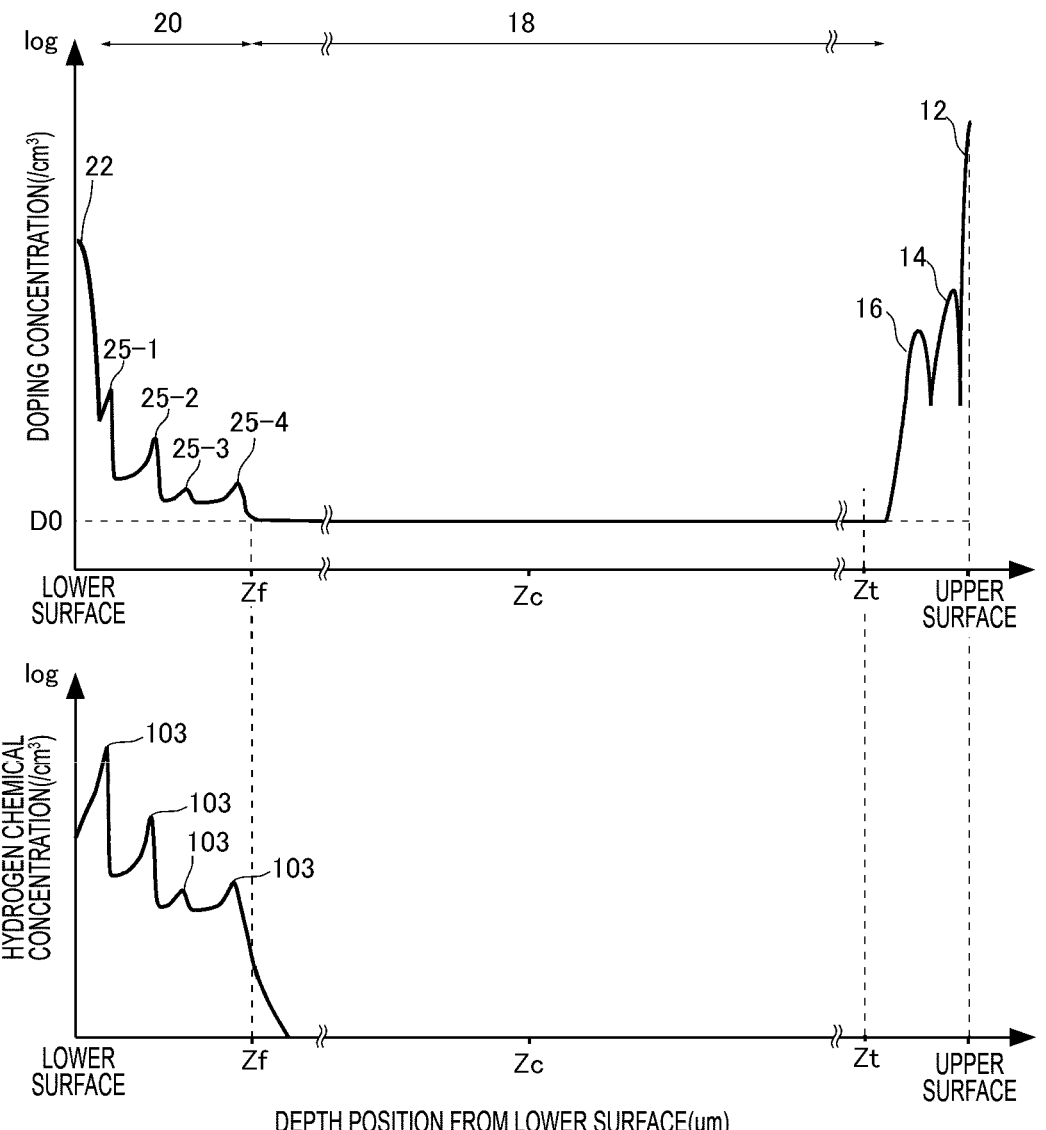
FIG. 15 illustrates a view showing an example of a doping concentration distribution and a hydrogen chemical concentration distribution taken along line F-F in FIG. 14.

FIG. 15 illustrates a view showing an example of the doping concentration distribution and the hydrogen chemical concentration distribution taken along line F-F in FIG. 14. The doping concentration distribution and the hydrogen chemical concentration distribution may be similar to those of the example of FIG. 5A. Note that although FIG. 15 shows an example in which each doping concentration peak in the doping concentration distribution can be clearly observed, any of the doping concentration peaks may not be clearly observed as in the example of FIG. 5A.

Figure 16:
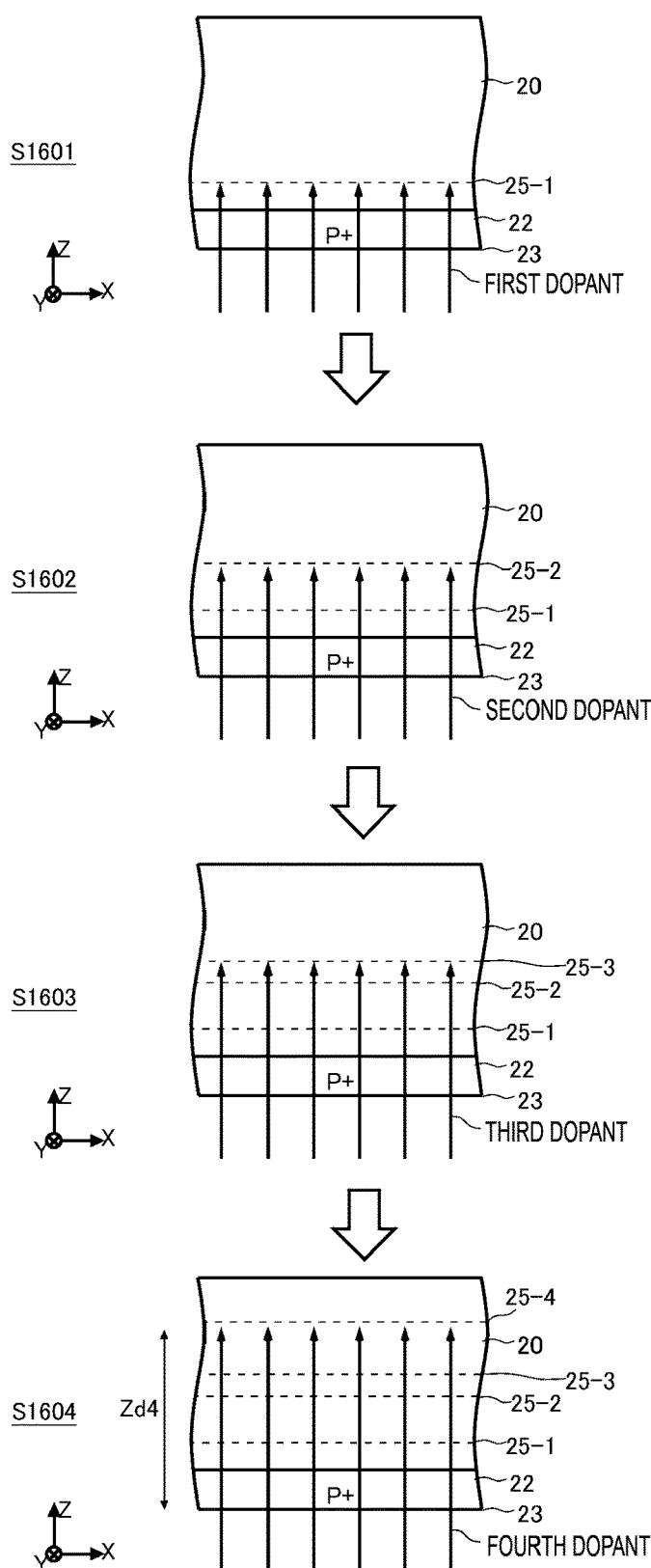
FIG. 16 illustrates a view showing an example of a method of forming the buffer region 20.

FIG. 16 illustrates a view showing an example of the method of forming the buffer region 20. FIG. 16 shows an implantation process of implanting a dopant into the buffer region 20. First, a first dopant of the N type is implanted into a first implantation position from the implantation surface of the semiconductor substrate 10 (S1601). In this example, the implantation surface is the lower surface 23, and the first implantation position is the depth position Zd1 (or Zh1) described in FIG. 5A and the like. Further, the first dopant is, for example, a hydrogen ion or a phosphorous ion.

After the first dopant is implanted, a second dopant of the N type is implanted from the implantation surface (the lower surface 23 in this example) of the semiconductor substrate 10 into a second implantation position having a larger distance from the implantation surface than the first implantation position (S1602). In this example, the second implantation position is the depth position Zd2 (or Zh2) described in FIG. 5A and the like. Further, the second dopant is, for example, a hydrogen ion or a phosphorous ion. The second dopant may be the same element as the first dopant. For example, both the first dopant and the second dopant are hydrogen ions. In another example, one of the first dopant and the second dopant may be a phosphorous ion, and the other may be a hydrogen ion.

After the second dopant is implanted, a third dopant of the N type is implanted from the implantation surface (the lower surface 23 in this example) of the semiconductor substrate 10 into a third implantation position having a larger distance from the implantation surface than the second implantation position (S1603). In this example, the third implantation position is the depth position Zd3 (or Zh3) described in FIG. 5A and the like. Further, the third dopant is, for example, a hydrogen ion or a phosphorous ion. The third dopant may be the same element as the first dopant or the second dopant. For example, the first dopant, the second dopant, and the third dopant are all hydrogen ions. In another example, some of the first dopant, the second dopant, and the third dopant may be hydrogen ions, and some may be phosphorous ions.

After the third dopant is implanted, a fourth dopant of the N type is implanted from the implantation surface (the lower surface 23 in this example) of the semiconductor substrate 10 into a fourth implantation position having a larger distance from the implantation surface than the third implantation position (S1604). In this example, the fourth implantation position is the depth position Zd4 (or Zh4) described in FIG. 5A and the like. Further, the fourth dopant is, for example, a hydrogen ion or a phosphorous ion. The fourth dopant may be the same element as the first dopant, the second dopant, or the third dopant. For example, the first dopant, the second dopant, the third dopant, and the fourth dopant are all hydrogen ions. In another example, some of the first dopant, the second dopant, the third dopant, and the fourth dopant may be hydrogen ions, and some may be phosphorous ions.

In the implantation process, three or more dopants of the N type including the first dopant and the second dopant may be implanted from the implantation surface of the semiconductor substrate 10 into the implantation positions having different depths from each other. In the example of FIG. 16, the dopants are implanted into four depth positions, but it is sufficient if the dopants are implanted into two or more depth positions.

When the dopant is implanted into the semiconductor substrate 10, foreign matter such as particles may adhere to the implantation surface. When the dopant is further implanted from the implantation surface with the foreign matter adhered to the implantation surface, the dopant is shielded by the foreign matter, and the dopant may not be able to be implanted precisely. In particular, when a distance between the depth position into which the dopant is implanted and the implantation surface is short, the acceleration energy of the dopant is small, and thus the dopant is easily shielded by the foreign matter.

According to this example, after the first dopant is implanted, the second dopant is implanted into a deeper position. Thus, even when the foreign matter adheres to the implantation surface in the process of implanting the second dopant (S1602), the implantation of the first dopant is not affected. Thus, the implantation of the first dopant having relatively small acceleration energy can be performed precisely.

In the implantation process, it is preferable to first implant a dopant to be implanted into the implantation position closest to the lower surface 23 of the semiconductor substrate 10 among the plurality of dopants to be implanted into the buffer region 20. In this example, the first dopant to be implanted into the implantation position closest to the lower surface 23 is implanted first. Accordingly, the implantation of the first dopant having the smallest acceleration energy can be performed precisely. In another example, the buffer region 20 may include a dopant that is implanted after the first dopant and that is implanted closer to the lower surface 23 than the first dopant.

In the implantation process, among the plurality of dopants to be implanted into the buffer region 20, a dopant to be implanted into the implantation position farthest from the lower surface 23 of the semiconductor substrate 10 may be implanted last. In this example, the fourth dopant to be implanted into the implantation position farthest from the lower surface 23 is implanted last. Accordingly, the implantation of each dopant having acceleration energy smaller than that of the fourth dopant can be performed precisely.

Further, as shown in FIG. 16, in the implantation process, dopants may be implanted in order from an implantation position closer to the lower surface 23 of the semiconductor substrate 10. Accordingly, the dopants can be implanted in order from the dopant having smaller acceleration energy, and thus the implantation of each dopant can be performed precisely.

A distance between the depth position Zd4, which is farthest from the lower surface 23 of the semiconductor substrate 10 among the implantation positions of the plurality of dopants to be implanted into the buffer region 20, and the lower surface 23 of the semiconductor substrate 10 may be half or less of the thickness of the semiconductor substrate 10. That is, the depth position Zd4 is arranged between the center position Zc (see FIG. 4A) of the semiconductor substrate 10 and the lower surface 23. In the manufacturing process of the semiconductor device 100, dopants of the same conductivity type to be implanted from the same implantation surface (the lower surface 23 in this example) into a region on the implantation surface side (the lower surface 23 side in this example) of the semiconductor substrate 10 may be implanted in order from a region closer to the implantation surface.

Further, in the top view, a range where the first dopant is implanted and a range where the second dopant is implanted may be the same. The implantation ranges of all the dopants of the first conductivity type to be implanted into the buffer region 20 in the implantation process may be the same.

Figure 17:
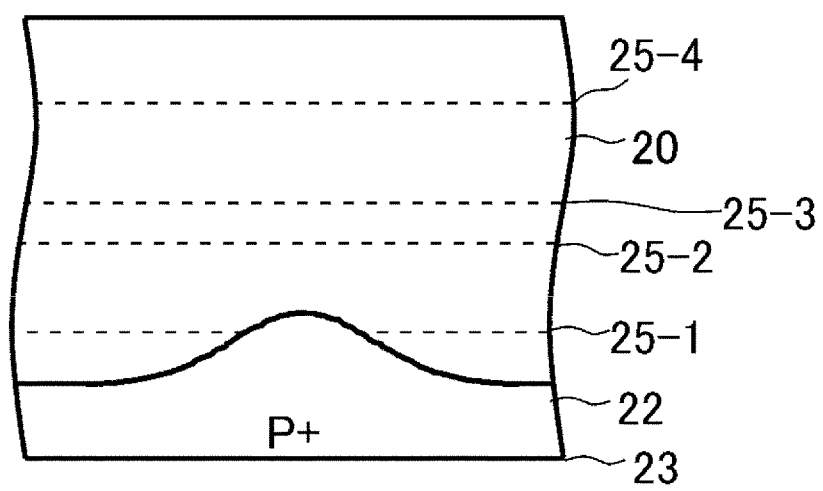
FIG. 17 illustrates a view showing a cross-sectional shape of a collector region 22 according to the comparative example.
Figure 17:
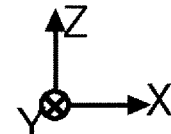

FIG. 17 illustrates a view showing a cross-sectional shape of the collector region 22 according to the comparative example. In this example, dopants are implanted into the buffer region 20 in order from a position farther from the lower surface 23. In this case, for example, a dopant, such as the first dopant, having a shallow implantation position and small acceleration energy may be shielded by particles on the implantation surface. When the first dopant is locally shielded, the doping concentration peak 25-1 is locally missing in an XY plane.

When the doping concentration peak 25-1 is locally missing, the donor concentration in the region becomes low, so that the collector region 22 easily enters the region. As a result, as shown in FIG. 17, a portion protruding upward is generated in a part of the collector region 22. Thus, when the semiconductor device 100 is turned off, the depletion layer expanding from the lower end of the base region 14 easily reaches the collector region 22, and the breakdown voltage decreases.

Figure 18:
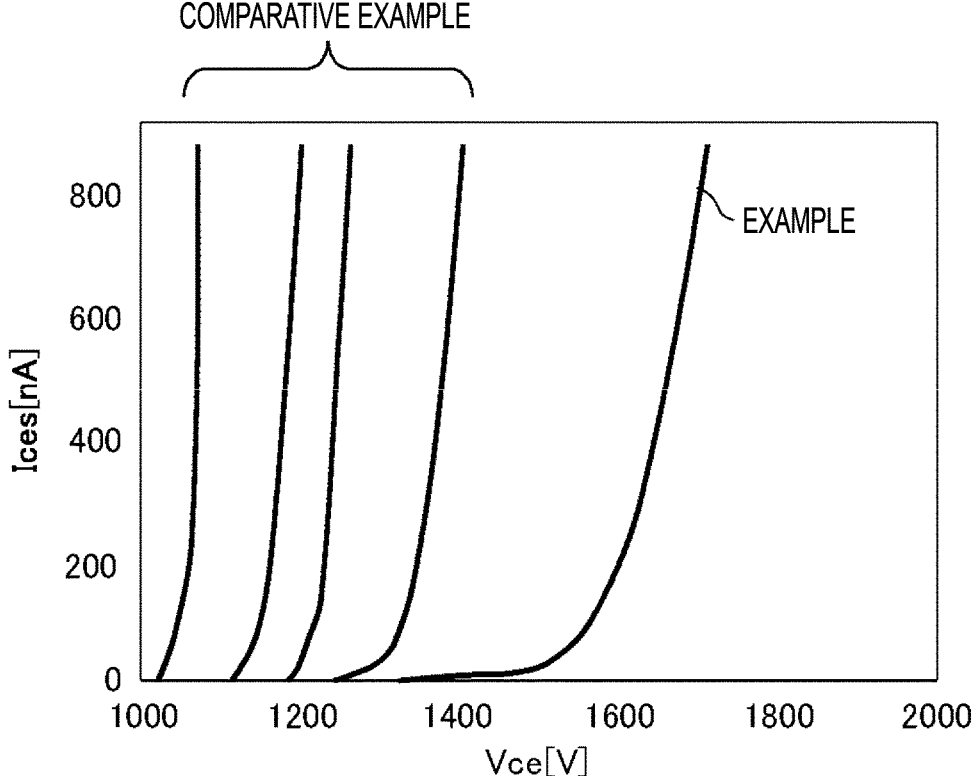
FIG. 18 illustrates a view showing a result of a breakdown voltage test of a semiconductor device.

FIG. 18 illustrates a view showing a result of a breakdown voltage test of the semiconductor device. In FIG. 18, a horizontal axis represents the voltage applied between the emitter and the collector of the semiconductor device in an off state, and a vertical axis represents the current flowing between the emitter and the collector of the semiconductor device. In the semiconductor device of the comparative example described in FIG. 17, when an emitter-collector voltage Vce is 1400 V or less, a large emitter-collector current Ices flows. In contrast, in the semiconductor device 100 according to the present example, even when the emitter-collector voltage Vce was approximately 1600 V, a large emitter-collector current Ices did not flow. That is, in the semiconductor device 100 according to the present example, a breakdown voltage is improved compared with that of the comparative example.

Figure 19:
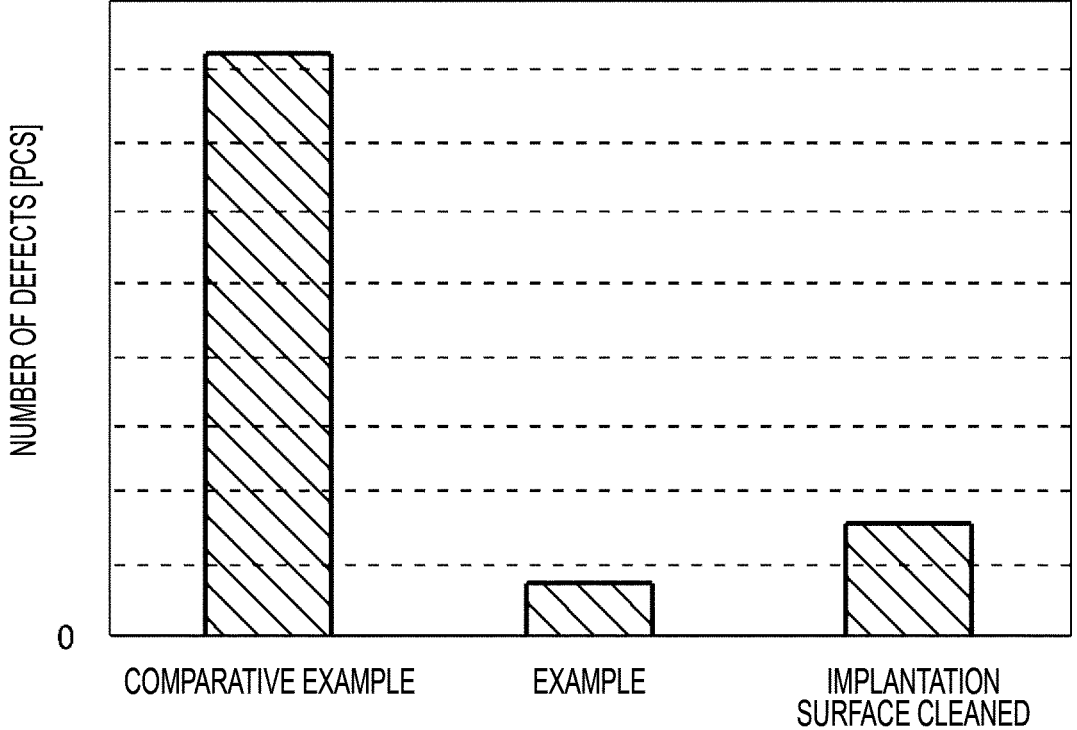
FIG. 19 illustrates a view showing a result of a breakdown voltage test of the semiconductor device.

FIG. 19 illustrates a view showing a result of a breakdown voltage test of the semiconductor device. FIG. 19 shows the number of semiconductor devices determined to be defective by the breakdown voltage test. In the breakdown voltage test, a semiconductor device having a predetermined breakdown voltage or less is determined to be defective. FIG. 19 shows test results of a semiconductor device of a reference example in which an implantation surface is cleaned and each dopant is implanted, in addition to the semiconductor device 100 according to the comparative example and the present example shown in FIG. 17. In the reference example, the dopant was implanted into the buffer region 20 in the same implantation order as in the comparative example, and the implantation surface was cleaned with water each time the dopant was implanted.

As shown in FIG. 19, according to the present example, the number of defects could be significantly reduced without changing the design of each concentration distribution in the buffer region 20 as compared with the comparative example. Further, the number of defects can be reduced in the present example as compared with the reference example in which the implantation surface is cleaned.

Figure 20:
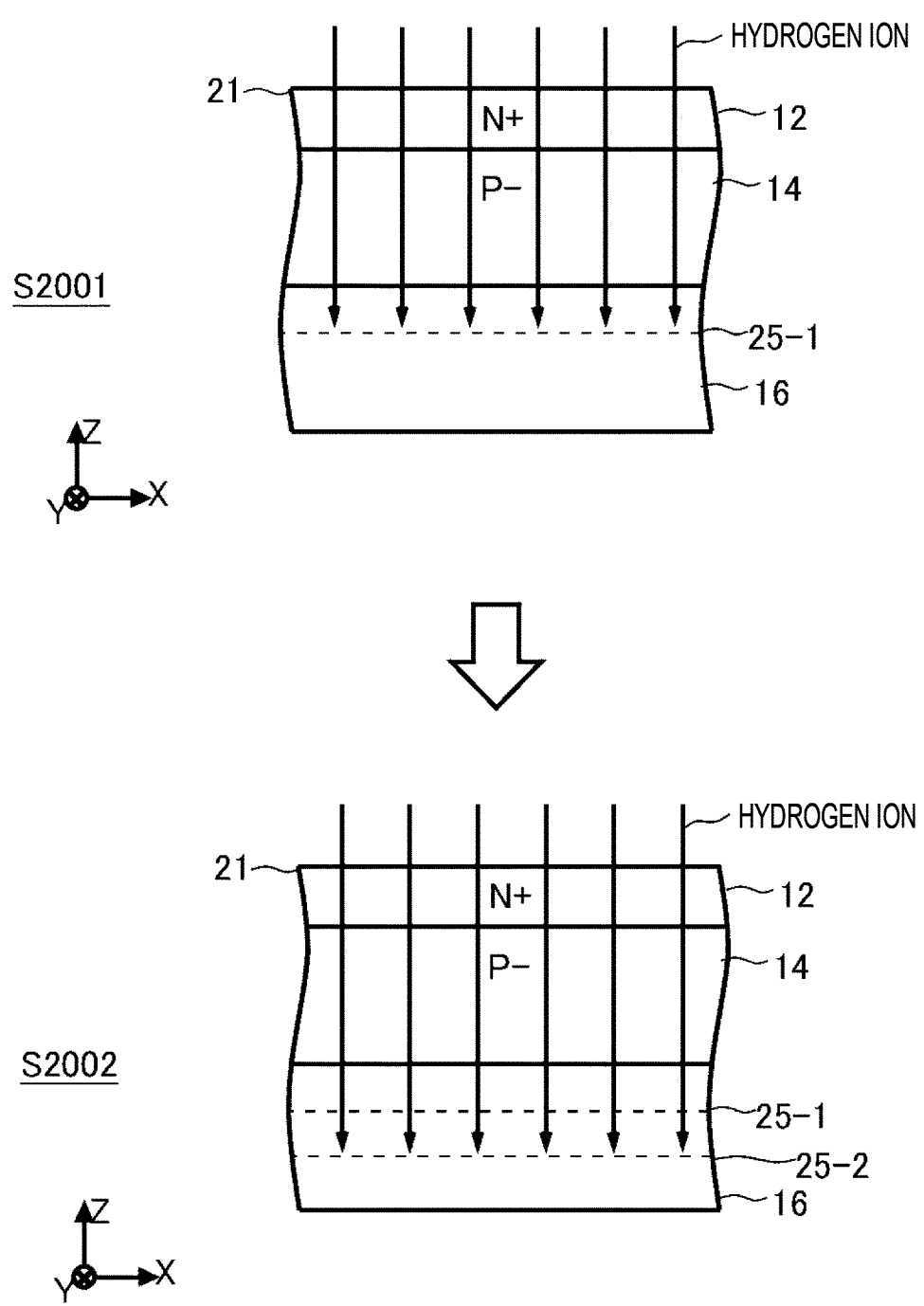
FIG. 20 illustrates a view showing another example of the semiconductor device 100.

FIG. 20 illustrates a view showing another example of the semiconductor device 100. In the example described in FIGS. 14 to 16, an example in which the buffer region 20 has the plurality of doping concentration peaks 25 has been described. In the semiconductor device 100 of this example, the accumulation region 16 has a plurality of doping concentration peaks 25. In FIG. 20, a process of implanting a dopant into the accumulation region 16 will be described. The buffer region 20 may or may not have a plurality of doping concentration peaks 25 formed in processes similar to those of the example of FIGS. 14 to 16.

In the process of implanting the dopant into the accumulation region 16, each dopant may be implanted in an order similar to that of the process of implanting the dopant into the buffer region 20 described in FIGS. 14 to 16. Note that this example is different from the example of FIGS. 14 to 16 in that the implantation surface is the upper surface 21 and the reference position of the implantation position of each dopant is the upper surface 21. Other content may be the same as that of the example of FIGS. 14 to 16. For example, in the description of the implantation process in FIG. 16, the "buffer region 20" may be replaced with the "accumulation region 16", and the "lower surface 23" may be replaced with the "upper surface 21".

In the example of FIG. 20, first, the first dopant of the N type is implanted into the first implantation position from the implantation surface of the semiconductor substrate 10 (S2001). In this example, the implantation surface is the upper surface 21. Further, the first implantation position is a position away from the upper surface 21 by the distance Zd1 or Zh1. Further, the first dopant is, for example, a hydrogen ion or a phosphorous ion.

After the first dopant is implanted, the second dopant of the N type is implanted from the implantation surface (the upper surface 21 in this example) of the semiconductor substrate 10 into the second implantation position having a larger distance from the implantation surface than the first implantation position (S2002). In this example, the second implantation position is a position away from the upper surface 21 by the distance Zd2 or Zh2. In this example, a first depth position (first implantation position) into which the first dopant is implanted and a second depth position (second implantation position) into which the second dopant is implanted are arranged in the accumulation region 16. Further, the second dopant is, for example, a hydrogen ion or a phosphorous ion. The second dopant may be the same element as the first dopant. For example, both the first dopant and the second dopant are hydrogen ions. In another example, one of the first dopant and the second dopant may be a phosphorous ion, and the other may be a hydrogen ion.

In the example of FIG. 20, the accumulation region 16 has two doping concentration peaks 25, but it is sufficient if the number of the doping concentration peaks 25 is two or more. According to this example, after the first dopant is implanted, the second dopant is implanted into a deeper position. Thus, even when the foreign matter adheres to the implantation surface in the process of implanting the second dopant (S2002), the implantation of the first dopant is not affected. Thus, the implantation of the first dopant having relatively small acceleration energy can be performed precisely.

Figure 21:
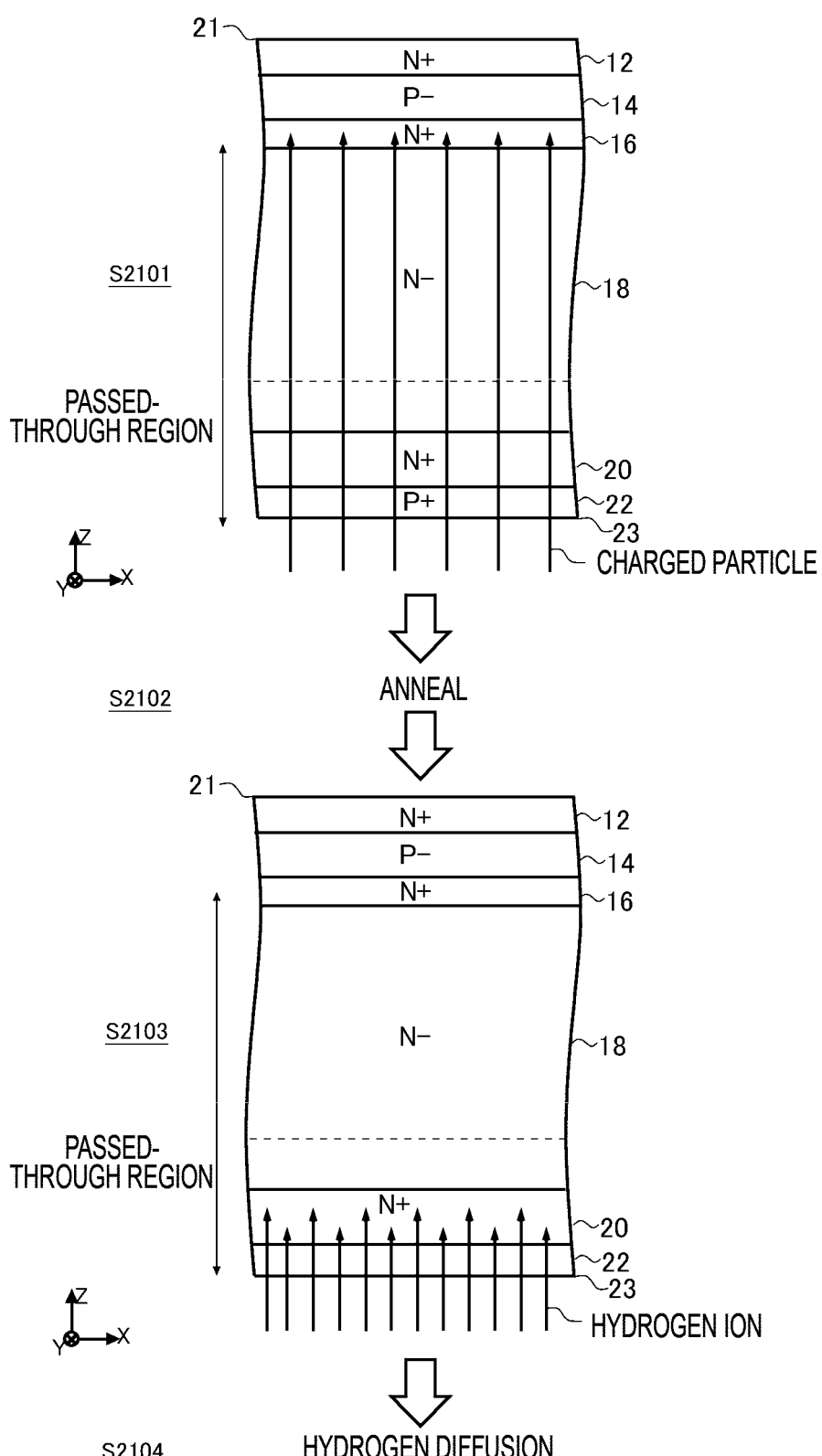
FIG. 21 illustrates a view showing another example of the manufacturing process of the semiconductor device 100.

FIG. 21 illustrates a view showing another example of the manufacturing process of the semiconductor device 100. In this example, the passed-through region forming process S2102 is executed before the implantation process described with reference to FIG. 16. Further, any of the dopants implanted into the buffer region 20 is hydrogen ions. At least one of the first dopant or the second dopant having a relatively high doping concentration may be a hydrogen ion. Further, the other dopant may be a hydrogen ion.

In the passed-through region forming process S2101, charged particles are implanted from the lower surface 23. The charged particles are hydrogen ions, helium ions, electron beams, or the like. The range of the charged particles is half or more of the thickness of the semiconductor substrate 10. The range of the charged particles may be larger than the thickness of the semiconductor substrate 10. The region of the semiconductor substrate 10 through which the charged particles have passed is referred to as a passed-through region. The passed-through region may include half or more of the drift region 18 in the depth direction, or may include the entire drift region 18.

In the passed-through region through which the charged particles have passed in the semiconductor substrate 10, the lattice defects mainly composed of vacancies such as monatomic vacancies (V) and divacancies (VV) are formed by the charged particles passing therethrough. Atoms adjacent to the vacancies have dangling bonds. The lattice defects also include interstitial atoms, dislocations, and the like, and may include donors and acceptors in a broad sense. However, in the present specification, the lattice defects mainly composed of vacancies may be referred to as vacancy-type lattice defects, vacancy-type defects, or simply lattice defects. In the present specification, the concentration of lattice defects mainly composed of vacancies may be referred to as a vacancy concentration. Further, since many lattice defects are formed due to the implantation of the charged particles into the semiconductor substrate 10, the crystallinity of the semiconductor substrate 10 may be strongly disturbed. In the present specification, this disturbance of crystallinity may be referred to as disorder.

After the passed-through region forming process S2101, an implantation process S2103 is performed. An annealing process S2102 of annealing the semiconductor substrate 10 may be performed between the passed-through region forming process S2101 and the implantation process S2103.

The implantation process S2103 includes processes S1601 to S1604 described in FIG. 16. As described above, in the implantation process S2103, hydrogen ions are implanted into at least one depth position of the buffer region 20. Thus, the buffer region 20 contains hydrogen.

After the implantation process S2103, a hydrogen diffusion process S2104 is performed. In the hydrogen diffusion process S2104, hydrogen in the buffer region 20 is diffused into the passed-through region by annealing the semiconductor substrate 10. The annealing temperature in hydrogen diffusion process S2104 may be equal to or lower than the annealing temperature in the annealing process S2102.

Oxygen is contained In the entire semiconductor substrate 10. The oxygen is introduced intentionally or unintentionally during manufacturing a semiconductor ingot. In the semiconductor substrate 10, hydrogen (H), vacancies (V), and oxygen (O) are combined to form a VOH defect. Further, by diffusing hydrogen after forming the passed-through region, lattice defects in the passed-through region are combined with hydrogen, and formation of the VOH defect is promoted. The VOH defect functions as a donor that supplies electrons. In the present specification, the VOH defect may be referred to simply as a hydrogen donor.

In the semiconductor substrate 10 of this example, the hydrogen donor is formed in a hydrogen ion passed-through region. The hydrogen donor in the passed-through region is formed when hydrogen terminates the dangling bond of vacancy-type lattice defects formed in the passed-through region and is further combined with oxygen. Therefore, the doping concentration distribution of the hydrogen donor in the passed-through region may follow a vacancy concentration distribution. The hydrogen chemical concentration in the passed-through region may be 10 times or more, or may be 100 times or more of the vacancy concentration formed in the passed-through region. The hydrogen in the passed-through region may be hydrogen remaining after the passage of hydrogen ions, or may be hydrogen diffused from a hydrogen supply source described below The doping concentration of the hydrogen donor is lower than the chemical concentration of hydrogen. When the ratio of the doping concentration of the hydrogen donor to the chemical concentration of hydrogen is defined as an activation ratio, the activation ratio may be a value of 0.1% to 30%. In this example, the activation ratio is 1% to 5%.

By forming a hydrogen donor in the passed-through region of the semiconductor substrate 10, the donor concentration in the passed-through region can be made higher than the bulk donor concentration. Normally, it is necessary to prepare the semiconductor substrate 10 having a predetermined bulk donor concentration in correspondence to characteristics of an element to be formed on the semiconductor substrate 10, particularly a rated voltage or a breakdown voltage. In this case, as described in FIG. 4A, the doping concentration of the drift region 18 is substantially equal to the bulk donor concentration. In contrast, according to the semiconductor device 100 shown in FIG. 21, the donor concentration of the semiconductor substrate 10 can be adjusted by controlling the dose amount of the charged particles or the hydrogen ions. Thus, the semiconductor device 100 having the drift region 18 with a predetermined doping concentration can be manufactured using a semiconductor substrate with a bulk donor concentration that does not correspond to the characteristics and the like of the element. The variation in the bulk donor concentration at the time of manufacturing the semiconductor substrate 10 is relatively large, but the dose amount of the hydrogen ions can be controlled with relatively high precision. Thus, the concentration of lattice defects generated by implanting hydrogen ions can also be controlled with high precision, and the donor concentration of the passed-through region can be controlled with high precision.

In the example of FIG. 21, the implantation process S2103 is performed after the passed-through region forming process S2101. In another example, the passed-through region forming process S2101 may be performed between the implantation process S2103 and the hydrogen diffusion process S2104.

Figure 22:
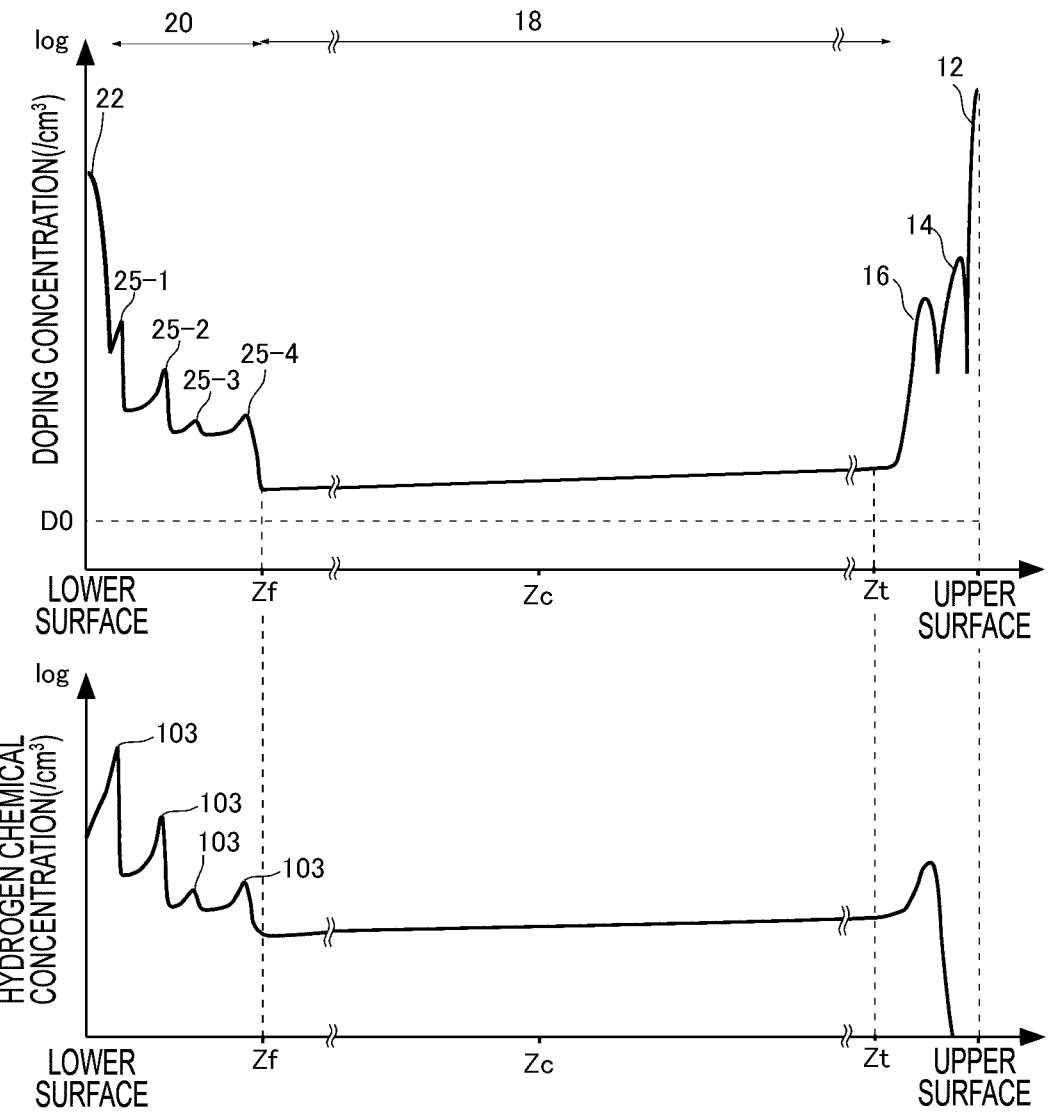
FIG. 22 illustrates a view showing an example of a doping concentration distribution and a hydrogen chemical concentration distribution of the semiconductor device 100 shown in FIG. 21.

FIG. 22 illustrates a view showing an example of the doping concentration distribution and the hydrogen chemical concentration distribution of the semiconductor device 100 shown in FIG. 21. FIG. 22 shows a concentration distribution at a position corresponding to the line F-F shown in FIG. 3. In this example, in the passed-through region forming process S2101, charged particles are implanted into the semiconductor substrate 10 in a range larger than the thickness of the semiconductor substrate 10. That is, most of the charged particles passes through the semiconductor substrate 10.

As described above, lattice defects are formed in a region through which the charged particles pass in the semiconductor substrate 10. In this example, the entire semiconductor substrate 10 is a passed-through region. Then, the hydrogen diffused from the buffer region 20 in the hydrogen diffusion process S2104 is combined with lattice defects to form VOH defects. Thus, the doping concentration in the passed-through region is higher than a bulk donor concentration D0.

Further, the hydrogen chemical concentration may monotonically decrease from the buffer region 20 toward the upper surface 21, may be flat, or may monotonically increase. For example, when hydrogen ions are implanted as the charged particles in the passed-through region forming process S2101, the hydrogen chemical concentration may monotonically increase from the buffer region 20 toward the upper surface 21. The doping concentration may monotonically decrease from the buffer region 20 toward the upper surface 21, may be flat, or may monotonically increase.

Third Example

Figure 23:
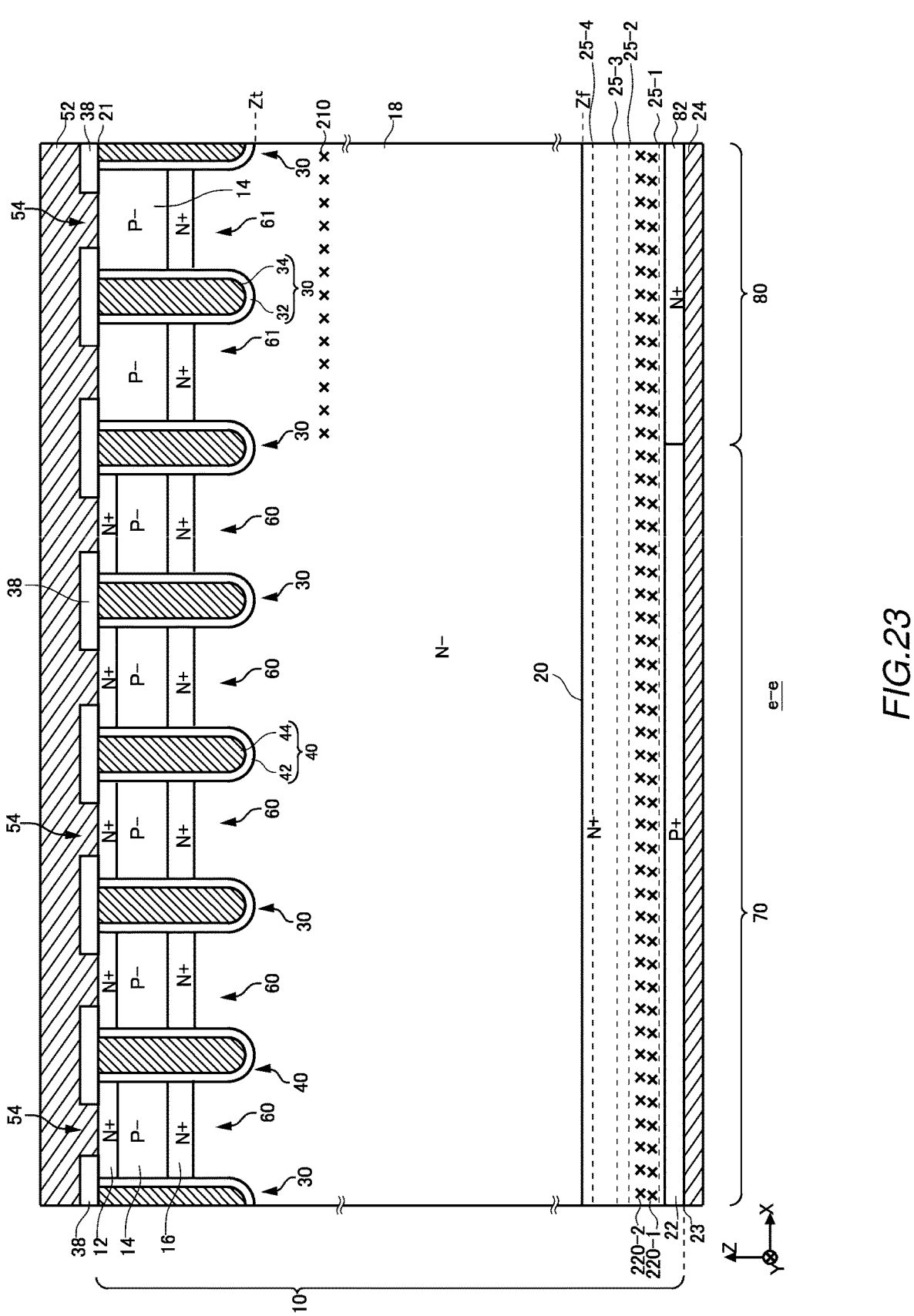
FIG. 23 illustrates a view showing still another example of the cross section e-e.

FIG. 23 illustrates a view showing another example of the cross section e-e. The semiconductor device 100 of this example is different from each example described in FIGS. 1 to 22 in that the buffer region 20 has a plurality of doping concentration peaks 25 and a plurality of lower-surface-side lifetime killers 220. The structure and the forming method of the plurality of doping concentration peaks 25 are the same as those in the second example described in FIGS. 14 to 22. Further, the structure and the forming method of the plurality of lower-surface-side lifetime killers 220 are similar to those of the first example described in FIGS. 1 to 13. The buffer region 20 has a plurality of helium chemical concentration peaks 221 corresponding to the plurality of lower-surface-side lifetime killers 220, as in the first example described in FIGS. 1 to 13. The structure other than the buffer region 20 is the same as any of the examples described in FIGS. 1 to 22.

Figure 24:
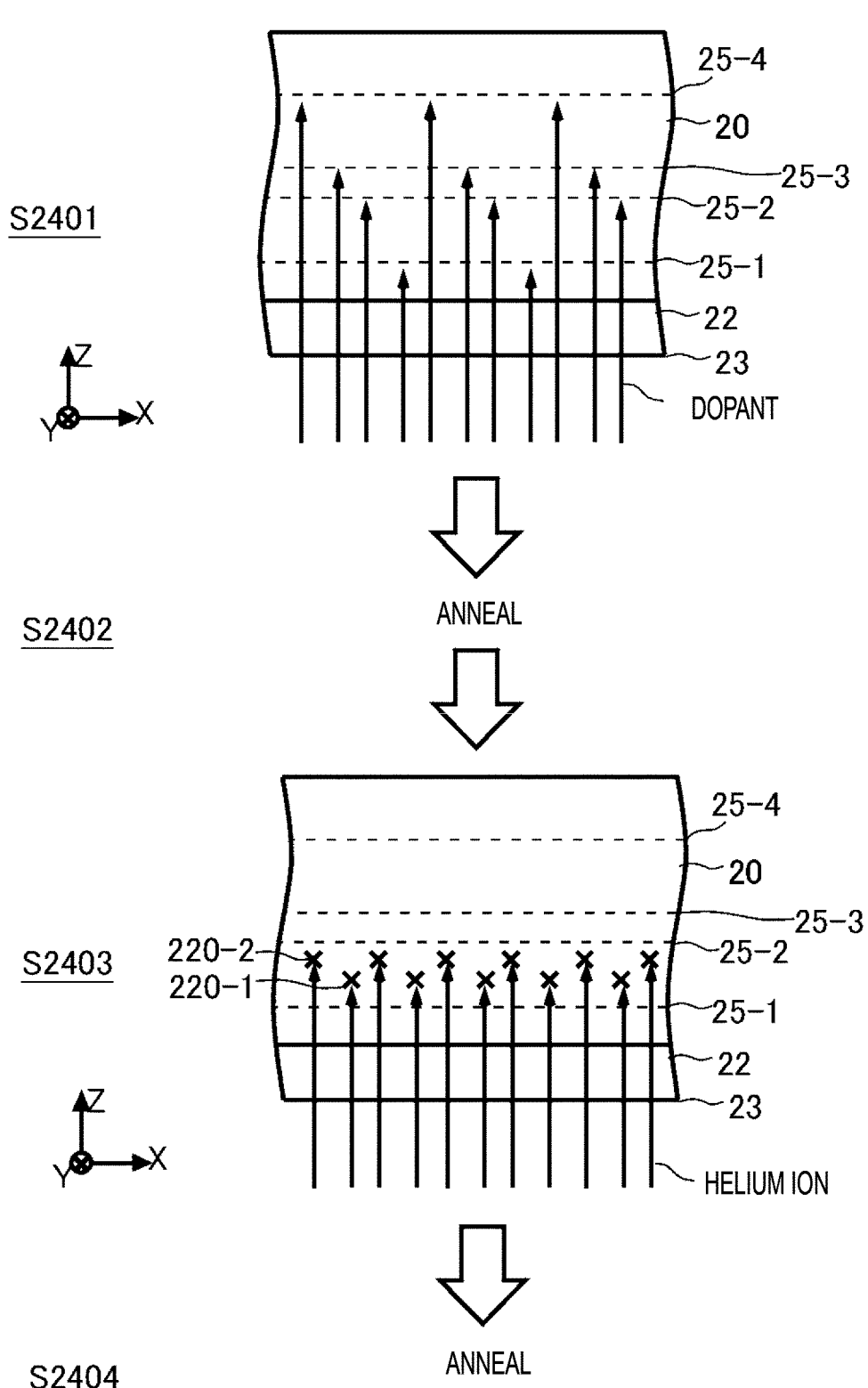
FIG. 24 illustrates a view showing an example of a method of forming the buffer region 20 shown in FIG. 23.

FIG. 24 illustrates a view showing an example of a method of forming the buffer region 20 shown in FIG. 23. In this example, first, in the implantation process S2401, dopants such as hydrogen ions are implanted into a plurality of depth positions of the buffer region 20. The implantation process S2401 includes processes S1601 to S1604 described in FIG. 16.

Next, in a first annealing process S2402, the semiconductor substrate 10 is annealed. Accordingly, the plurality of doping concentration peaks 25 can be formed in the buffer region 20.

Next, in a helium implantation process S2403, helium ions are implanted into different depth positions of the buffer region 20 from the lower surface 23. In the helium implantation process S2403, helium ions may be implanted in order from a depth position closer to the lower surface 23. In another example, helium ions may be implanted in a different order. In the helium implantation process S2403, helium ions also may be implanted in order from a depth position farther from the lower surface 23. Even when the helium chemical concentration peak 221 is locally missing, the protrusion of the collector region 22 as shown in FIG. 17 is not formed. Further, by performing the implantation process S2401 before the helium implantation process S2403, it is possible to prevent the dopant in the implantation process S2401 from being shielded by the foreign matter adhering to the implantation surface in the helium implantation process S2403.

A second annealing process S2404 of annealing the semiconductor substrate 10 may be performed after the helium implantation process S2403. Accordingly, excessive lattice defects or the like generated in the helium implantation process S2403 can be terminated with hydrogen. The annealing temperature in the second annealing process S2404 may be lower than the annealing temperature in the first annealing process S2402.

In this example, the helium implantation process S2403 is performed after the implantation process S2401. In another example, the implantation process S2401 may be performed after the helium implantation process S2403. An annealing process is preferably performed after each implantation process.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
 a semiconductor substrate having a drift region of a first conductivity type; and
 a buffer region of the first conductivity type provided between the drift region and a lower surface of the semiconductor substrate and having throughout a higher doping concentration than the drift region, wherein
 the buffer region has two or more helium chemical concentration peaks arranged at different positions in a depth direction of the semiconductor substrate, and
 the two or more helium chemical concentration peaks each have two points at which a full width, half maximum intersect, with the two points of each of the two or more helium chemical concentration peaks being arranged farther away from the lower surface of the semiconductor substrate than two points at which a full width, half maximum intersect a shallowest hydrogen chemical concentration peak.

2. The semiconductor device according to claim 1, wherein
 the two or more helium chemical concentration peaks of the buffer region include a first helium chemical concentration peak and a second helium chemical concentration peak arranged farther away from the lower surface of the semiconductor substrate than the first helium chemical concentration peak, and
 a distribution width of the second helium chemical concentration peak is larger than a distribution width of the first helium chemical concentration peak.

3. The semiconductor device according to claim 2, wherein the first helium chemical concentration peak has a higher helium chemical concentration than the second helium chemical concentration peak.

4. The semiconductor device according to claim 2, wherein the first helium chemical concentration peak has a lower helium chemical concentration than the second helium chemical concentration peak.

5. The semiconductor device according to claim 1, wherein the buffer region has three or more helium chemical concentration peaks arranged at different positions in the depth direction of the semiconductor substrate.

6. The semiconductor device according to claim 1, wherein a peak interval between two of the helium chemical concentration peaks that are adjacent to each other in the depth direction is uniform in the buffer region.

7. The semiconductor device according to claim 1, wherein
 the two or more helium chemical concentration peaks are arranged with respective peak intervals in the depth direction, the respective peak intervals comprising a first peak interval and a second peak interval, and
 the first peak interval is larger than the second peak interval at a position farther away from the lower surface of the semiconductor substrate than the first peak interval.

8. The semiconductor device according to claim 1, wherein
 the two or more helium chemical concentration peaks are arranged with respective peak intervals in the depth direction the respective peak intervals comprising a first peak interval and a second peak interval, and
 the first peak interval is smaller than the second peak interval at a position farther away from the lower surface of the semiconductor substrate than the first peak interval.

9. The semiconductor device according to claim 1, wherein the buffer region has one or more hydrogen chemical concentration peaks, and each of the two or more helium chemical concentration peaks is arranged at a depth position different from that of any of the one or more hydrogen chemical concentration peaks.

10. The semiconductor device according to claim 9, wherein the full width at half maximum of each of the two or more helium chemical concentration peaks is smaller than a full width at half maximum of any of the one or more hydrogen chemical concentration peaks arranged farther away from the lower surface of the semiconductor substrate than each of the two or more helium chemical concentration peaks.

11. The semiconductor device according to claim 1, wherein the buffer region has two or more doping concentration peaks arranged at different positions in the depth direction of the semiconductor substrate, the two or more doping concentration peaks include a deepest doping concentration peak arranged farthest away from the lower surface of the semiconductor substrate, and the two or more helium chemical concentration peaks are arranged between the deepest doping concentration peak and the lower surface of the semiconductor substrate.

12. The semiconductor device according to claim 11, wherein the two or more doping concentration peaks include a shallowest doping concentration peak closest to the lower surface of the semiconductor substrate, and the two or more helium chemical concentration peaks are arranged between the deepest doping concentration peak and the shallowest doping concentration peak.

13. The semiconductor device according to claim 11, wherein the two or more helium chemical concentration peaks are arranged between two of the two or more doping concentration peaks that are adjacent to each other in the depth direction.

14. The semiconductor device according to claim 1, wherein the buffer region includes a depletion layer edge position where an integrated concentration obtained by integrating net doping concentrations of the drift region and the buffer region from an upper end of the drift region toward the lower surface of the semiconductor substrate reaches a critical integrated concentration, and the buffer region has a first helium chemical concentration peak arranged closer to the lower surface side of the semiconductor substrate than the depletion layer edge position and a second helium chemical concentration peak arranged closer to an upper surface side of the semiconductor substrate than the depletion layer edge position.

15. The semiconductor device according to claim 14, wherein the first helium chemical concentration peak has a higher helium chemical concentration than the second helium chemical concentration peak.

16. The semiconductor device according to claim 14, wherein the buffer region has a first doping concentration peak, a second doping concentration peak arranged farther away from the lower surface of the semiconductor substrate than the first doping concentration peak, and a third doping concentration peak arranged farther away from the lower surface of the semiconductor substrate than the second doping concentration peak, and the first helium chemical concentration peak is arranged between the first doping concentration peak and the second doping concentration peak, and the second helium chemical concentration peak is arranged between the second doping concentration peak and the third doping concentration peak.

17. The semiconductor device according to claim 16, wherein the depletion layer edge position is arranged in a range of a full width at half maximum of the second doping concentration peak.

18. The semiconductor device according to claim 1, further comprising an upper-surface-side lifetime killer arranged on an upper surface side of the semiconductor substrate.

19. The semiconductor device according to claim 1, wherein the full width at half maximum of each of the helium chemical concentration peaks is 1 μm or less.

20. The semiconductor device according to claim 1, wherein the two or more helium chemical concentration peaks have a same helium chemical concentration.

21. The semiconductor device according to claim 1, wherein each of the two or more helium chemical concentration peaks is singular, and the two or more helium chemical concentration peaks are provided between directly adjacent two doping concentration peaks in the buffer region.

* * * * *